(12) United States Patent
Lochtefeld

(10) Patent No.: US 9,299,562 B2
(45) Date of Patent: *Mar. 29, 2016

(54) DEVICES FORMED FROM A NON-POLAR PLANE OF A CRYSTALLINE MATERIAL AND METHOD OF MAKING THE SAME

(71) Applicant: Taiwan Semiconductor Manufacturing Company, Ltd., Hsin-Chu (TW)

(72) Inventor: Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 19 days.

This patent is subject to a terminal disclaimer.

(21) Appl. No.: 14/106,454

(22) Filed: Dec. 13, 2013

(65) Prior Publication Data

US 2014/0162438 A1 Jun. 12, 2014

Related U.S. Application Data

(63) Continuation of application No. 12/753,049, filed on Apr. 1, 2010, now Pat. No. 8,629,446, which is a continuation of application No. PCT/US2010/029552, filed on Apr. 1, 2010.

(60) Provisional application No. 61/166,184, filed on Apr. 2, 2009.

(51) Int. Cl.
  *H01L 33/16* (2010.01)
  *H01L 21/18* (2006.01)
  (Continued)

(52) U.S. Cl.
  CPC ...... *H01L 21/02609* (2013.01); *H01L 21/0243* (2013.01); *H01L 21/0254* (2013.01); *H01L 21/02458* (2013.01); *H01L 21/02494* (2013.01); *H01L 29/861* (2013.01);
  (Continued)

(58) Field of Classification Search
  None
  See application file for complete search history.

(56) References Cited

U.S. PATENT DOCUMENTS

| 4,307,510 A | 12/1981 | Sawyer et al. |
| 4,322,253 A | 3/1982 | Pankove et al. |

(Continued)

FOREIGN PATENT DOCUMENTS

| CN | 2550906 | 5/2003 |
| DE | 10017137 | 10/2000 |

(Continued)

OTHER PUBLICATIONS

Kwok K. Ng, "Resonant-Tunneling Diode," Complete Guide to Semiconductor Devices, Chapter 10. Nov. 3, 2010, pp. 75-83.

(Continued)

*Primary Examiner* — Pamela E Perkins
(74) *Attorney, Agent, or Firm* — Slater & Matsil, L.L.P.

(57) ABSTRACT

Materials, methods, structures and device including the same can provide a semiconductor device such as an LED using an active region corresponding to a non-polar face or surface of III-V semiconductor crystalline material. In some embodiments, an active diode region contains more non-polar III-V material oriented to a non-polar plane than III-V material oriented to a polar plane. In other embodiments, a bottom region contains more non-polar m-plane or a-plane surface area GaN than polar c-plane surface area GaN facing an active region.

20 Claims, 13 Drawing Sheets

(51) Int. Cl.
  *H01L 29/22* (2006.01)
  *H01L 21/02* (2006.01)
  *H01L 31/0304* (2006.01)
  *H01L 33/00* (2010.01)
  *H01L 33/24* (2010.01)
  *H01L 29/861* (2006.01)
  *H01L 33/12* (2010.01)
  *H01L 33/08* (2010.01)

(52) U.S. Cl.
  CPC ......... *H01L 31/0304* (2013.01); *H01L 33/007* (2013.01); *H01L 33/24* (2013.01); *H01L 33/08* (2013.01); *H01L 33/12* (2013.01); *H01L 33/16* (2013.01); *Y02E 10/544* (2013.01); *Y02P 70/521* (2015.11)

(56) References Cited

U.S. PATENT DOCUMENTS

| | | |
|---|---|---|
| 4,370,510 A | 1/1983 | Stirn |
| 4,545,109 A | 10/1985 | Reichert |
| 4,551,394 A | 11/1985 | Betsch et al. |
| 4,651,179 A | 3/1987 | Reichert |
| 4,727,047 A | 2/1988 | Bozler et al. |
| 4,774,205 A | 9/1988 | Choi et al. |
| 4,789,643 A | 12/1988 | Kajikawa |
| 4,826,784 A | 5/1989 | Salerno et al. |
| 4,860,081 A | 8/1989 | Cogan |
| 4,876,210 A | 10/1989 | Barnett et al. |
| 4,948,456 A | 8/1990 | Schubert |
| 4,963,508 A | 10/1990 | Umeno et al. |
| 5,032,893 A | 7/1991 | Fitzgerald, Jr. et al. |
| 5,034,337 A | 7/1991 | Mosher et al. |
| 5,061,644 A | 10/1991 | Yue et al. |
| 5,079,616 A | 1/1992 | Yacobi et al. |
| 5,091,333 A | 2/1992 | Fan et al. |
| 5,091,767 A | 2/1992 | Bean et al. |
| 5,093,699 A | 3/1992 | Weichold et al. |
| 5,098,850 A | 3/1992 | Nishida et al. |
| 5,105,247 A | 4/1992 | Cavanaugh |
| 5,108,947 A | 4/1992 | Demeester et al. |
| 5,156,995 A | 10/1992 | Fitzgerald, Jr. et al. |
| 5,159,413 A | 10/1992 | Calviello et al. |
| 5,164,359 A | 11/1992 | Calviello et al. |
| 5,166,767 A | 11/1992 | Kapoor et al. |
| 5,223,043 A | 6/1993 | Olson et al. |
| 5,236,546 A | 8/1993 | Mizutani |
| 5,238,869 A | 8/1993 | Shichijo et al. |
| 5,256,594 A | 10/1993 | Wu et al. |
| 5,269,852 A | 12/1993 | Nishida |
| 5,269,876 A | 12/1993 | Mizutani |
| 5,272,105 A | 12/1993 | Yacobi et al. |
| 5,281,283 A | 1/1994 | Tokunaga et al. |
| 5,285,086 A | 2/1994 | Fitzgerald, Jr. |
| 5,295,150 A | 3/1994 | Vangieson et al. |
| 5,356,831 A | 10/1994 | Calviello et al. |
| 5,403,751 A | 4/1995 | Nishida et al. |
| 5,405,453 A | 4/1995 | Ho et al. |
| 5,407,491 A | 4/1995 | Freundlich et al. |
| 5,410,167 A | 4/1995 | Saito |
| 5,417,180 A | 5/1995 | Nakamura |
| 5,427,976 A | 6/1995 | Koh et al. |
| 5,432,120 A | 7/1995 | Meister et al. |
| 5,438,018 A | 8/1995 | Mori et al. |
| 5,461,243 A | 10/1995 | Ek et al. |
| 5,518,953 A | 5/1996 | Takasu |
| 5,528,209 A | 6/1996 | MacDonald et al. |
| 5,545,586 A | 8/1996 | Koh |
| 5,548,129 A | 8/1996 | Kubena |
| 5,589,696 A | 12/1996 | Baba |
| 5,621,227 A | 4/1997 | Joshi |
| 5,622,891 A | 4/1997 | Saito |
| 5,640,022 A | 6/1997 | Inai |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,825,240 A | 10/1998 | Geis et al. |
| 5,849,077 A | 12/1998 | Kenney |
| 5,853,497 A | 12/1998 | Lillington et al. |
| 5,869,845 A | 2/1999 | Vander Wagt et al. |
| 5,883,549 A | 3/1999 | De Los Santos |
| 5,886,385 A | 3/1999 | Arisumi et al. |
| 5,903,170 A | 5/1999 | Kulkarni et al. |
| 5,953,361 A | 9/1999 | Borchert et al. |
| 5,959,308 A | 9/1999 | Shichijo et al. |
| 5,966,620 A | 10/1999 | Sakaguchi et al. |
| 5,998,781 A | 12/1999 | Vawter et al. |
| 6,011,271 A | 1/2000 | Sakuma et al. |
| 6,015,979 A | 1/2000 | Sugiura et al. |
| 6,049,098 A | 4/2000 | Sato |
| 6,083,598 A | 7/2000 | Ohkubo et al. |
| 6,100,106 A | 8/2000 | Yamaguchi et al. |
| 6,110,813 A | 8/2000 | Ota et al. |
| 6,111,288 A | 8/2000 | Watanabe et al. |
| 6,121,542 A | 9/2000 | Shiotsuka et al. |
| 6,150,242 A | 11/2000 | Van de Wagt et al. |
| 6,153,010 A | 11/2000 | Kiyoku et al. |
| 6,191,432 B1 | 2/2001 | Sugiyama et al. |
| 6,225,650 B1 | 5/2001 | Tadatomo et al. |
| 6,228,691 B1 | 5/2001 | Doyle |
| 6,229,153 B1 | 5/2001 | Botez et al. |
| 6,235,547 B1 | 5/2001 | Sakuma et al. |
| 6,252,261 B1 | 6/2001 | Usui et al. |
| 6,252,287 B1 | 6/2001 | Kurtz et al. |
| 6,271,551 B1 | 8/2001 | Schmitz et al. |
| 6,274,889 B1 | 8/2001 | Ota et al. |
| 6,300,650 B1 | 10/2001 | Sato |
| 6,320,220 B1 | 11/2001 | Watanabe et al. |
| 6,325,850 B1 | 12/2001 | Beaumont et al. |
| 6,339,232 B1 | 1/2002 | Takagi |
| 6,342,404 B1 | 1/2002 | Shibata et al. |
| 6,348,096 B1 | 2/2002 | Sunakawa et al. |
| 6,352,942 B1 | 3/2002 | Luan et al. |
| 6,362,071 B1 | 3/2002 | Nguyen et al. |
| 6,380,051 B1 | 4/2002 | Yuasa et al. |
| 6,380,590 B1 | 4/2002 | Yu |
| 6,403,451 B1 | 6/2002 | Linthicum et al. |
| 6,407,425 B1 | 6/2002 | Babcock et al. |
| 6,456,214 B1 | 9/2002 | van der Wagt |
| 6,458,614 B1 | 10/2002 | Nanishi et al. |
| 6,475,869 B1 | 11/2002 | Yu |
| 6,492,216 B1 | 12/2002 | Yeo et al. |
| 6,500,257 B1 | 12/2002 | Wang et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |

(56) References Cited

U.S. PATENT DOCUMENTS

| | | |
|---|---|---|
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B2 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,282,746 B2 | 10/2007 | Lee et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 8,629,446 B2 * | 1/2014 | Lochtefeld .................. 257/65 |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |

(56) References Cited

U.S. PATENT DOCUMENTS

| | | |
|---|---|---|
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0232416 A1 | 9/2008 | Okamoto et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0086498 A1 | 4/2011 | Cheng et al. |
| 2013/0044782 A1 | 2/2013 | Raring |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |

(56) References Cited

FOREIGN PATENT DOCUMENTS

| | | |
|---|---|---|
| GB | 2215514 | 9/1989 |
| JP | 2062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2007201018 | 8/2007 |
| JP | 2009177167 | 8/2009 |
| KR | 20030065631 | 8/2003 |
| KR | 20070008026 | 1/2007 |
| KR | 20090010284 | 1/2009 |
| TW | 544930 | 8/2003 |
| WO | WO0072383 | 11/2000 |
| WO | WO0101465 | 1/2001 |
| WO | WO0209187 | 1/2002 |
| WO | WO02086952 | 10/2002 |
| WO | WO02088834 | 11/2002 |
| WO | WO03073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2008124154 | 10/2008 |

OTHER PUBLICATIONS

"Communication pursuant to Article 94(3) EPC," Application No. 06 770 525.1-2203, Applicant: Taiwan Semiconductor Company, Ltd., Feb. 17, 2011, 4 pages.

68 Applied Physics Letters 7, 1999, pp. 774-779 (trans. of relevant portions attached).

Ames, "Intel Says More Efficient Chips are Coming," PC World, available at: http://www.pcworld.com/printable/article/id,126044/printable.html (Jun. 12, 2006); 4 pages.

Asano et al., "AlGaInN laser diodes grown on an ELO-GaN substrate vs. on a sapphire substrate," Semiconductor Laser Conference (2000) Conference Digest, IEEE 17th International, 2000, pp. 109-110.

Asaoka, et al., "Observation of 1 f $^x$/noise of GaInP/GaAs triple barrier resonant tunneling diodes, " AIP Conf. Proc., vol. 780, Issue 1 , 2005, pp. 492-495.

Ashby, et al., "Low-dislocation-density GaN from a single growth on a textured substrate," Applied Physics Letters, vol. 77, No. 20, Nov. 13, 2000, pp. 3233-3235.

Ashley, et al., "Heterogeneous InSb Quantum Well Transistors on Silicon for Ultra-High Speed, Low Power Logic Applications," 43 Electronics Letters 14, Jul. 2007, 2 pages.

Bai et al., "Study of the Defect Elimination Mechanisms in Aspect Ratio Trapping Ge Growth," Applied Physics Letters, vol. 90, 2007, 3 pages.

Bakkers et al., "Epitaxial Growth on InP Nanowires on Germanium," Nature Materials, vol. 3, Nov. 2004, pp. 769-773.

Baron et al., "Chemical Vapor Deposition of Ge Nanocrystals on $SiO_2$," Applied Physics Letters, vol. 83, No. 7, Aug. 18, 2003, pp. 1444-1446.

Bean et al., "$Ge_xSi_{1-x}$/Si strained-later Superlattice grown by molecular beam Epitaxy," Journal of Vacuum Science Technology A2 (2), Jun. 1984, pp. 436-440.

Beckett et al., "Towards a reconfigurable nanocomputer platform," ACM International Conference Proceeding Series, vol. 19, 2002, pp. 141-150.

Beltz et al., "A Theoretical Model for Threading Dislocation Reduction During Selective Area Growth," Materials Science and Engineering, A234-236, 1997, pp. 794-797.

Belyaev, et al., "Resonance and current instabilities in AlN/GaN resonant tunneling diodes," 21 Physica E 2-4, 2004, pp. 752-755.

Berg, J., "Electrical Characterization of Silicon Nanogaps," Doktorsavhandlingar vid Chalmers Tekniska Hagskola, 2005, No. 2355, 2 pages.

Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.

Blakeslee, "The Use of Superlattices to Block the Propagation of Dislocations in Semiconductors," Mat. Res. Soc. Symposium Proceedings 148, 1989, pp. 217-227.

Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.

Borland, "Novel Device structures by selective epitaxial growth (SEG)," Electron Devices Meeting, vol. 33, 1987, pp. 12-15.

Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.

Burenkov et al., "Corner Effect in Double and Triple Gate FinFETs" European solid-state device research, 33rd Conference on Essderc '03 Sep. 16-18, 2003, Piscataway, NJ, USA, IEEE, vol. 16, pp. 135-138, XPo10676716.

Bushroa et al., "Lateral epitaxial overgrowth and reduction in defect density of 3C-SiC on patterned Si substrates," Journal of Crystal Growth, vol. 271, No. 1-2, Oct. 15, 2004, pp. 200-206.

Calado, et al., "Modeling of a resonant tunneling diode optical modulator," University of Algarve, Department of Electronics and Electrical Engineering, 2005, pp. 96-99.

Campo et al., "Comparison of Etching Processes of Silicon and Germanium in SF6-O2 Radio-Frequency Plasma," 13 Journal of Vac. Sci. Tech., B-2, 1995, pp. 235-241.

Cannon et al., "Monolithic Si-based Technology for Optical Receiver Circuits," Proceedings of SPIE, vol. 4999, 2003, pp. 145-155.

Chan et al., "Influence of Metalorganic Sources on the Composition Uniformity of Selectively Grown $Ga_xIn_{1-x}P$," Japan. Journal of Applied Physics, vol. 33, 1994, pp. 4812-4819.

Chang et al. "3-D simulation of strained Si/SiGe heterojunction FinFETs" Semiconductor Device Research Symposium, Dec. 10-12, 2003, pp. 176-177.

Chang et al., "Effect of growth temperature on epitaxial lateral overgrowth of GaAs on Si substrate," Journal of Crystal Growth, vol. 174, No. 1-4, Apr. 1997, pp. 630-634.

Chang et al., "Epitaxial Lateral Overgrowth of Wide Dislocation-Free GaAs on Si Substrates," Electrochemical Society Proceedings, vol. 97-21, May 13, 1998, pp. 196-200.

Chau et al., Opportunities and Challenges of III-V Nanoelectronics for Future High-Speed, Low Power Logic Applications, IEEE CSIC Digest, 2005, pp. 17-20.

Chen et al., "Dislocation reduction in GaN thin films via lateral overgrowth from trenches," Applied Physics Letters, vol. 75, No. 14, Oct. 4, 1999, pp. 2062-2063.

Chengrong, et al., "DBRTD with a high PVCR and a peak current density at room temperature," Chinese Journal of Semiconductors vol. 26, No. 10, Oct. 2005, pp. 1871-1874.

Choi et al., "Monolithic Integration GaAs/AlGaAs LED and Si Driver Circuit," 9 Electron Device Letters 10, Oct. 1988, 3 pages.

Choi et al., "Monolithic Integration of GaAs/AlGaAs Double-Heterostructure LEDs and Si MOSFETs," Electron Device Letters, vol. EDL-7, No. 9, Sep. 1986, 3 pages.

(56) References Cited

OTHER PUBLICATIONS

Choi et al., "Monolithic Integration of Si MOSFETs and GaAs MESFETs," Electron Device Letters, vol. EDL-7, No. 4, Apr. 1986, 3 pages.
Choi, et al., "Low-voltage low-power K-band balanced RTD-based MMIC VCO," 2006 IEEE, Department of EECS, Korea Advanced Institute of Science and Technology, 2006, pp. 743-746.
Cloutier et al., "Optical gain and stimulated emission in periodic nanopatterned crystalline silicon," Nature Materials, Nov. 2005, 5 pages.
Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.
Dadgar et al., "MOVPE growth of GaN on Si (111) substrates," Journal of Crystal Growth, vol. 248, Feb. 1, 2003, pp. 556-562.
Datta et al., "Silicon and III-V Nanoelectronics," IEEE International Conference on Indium Phosphide & Related Materials, 2005, pp. 7-8.
Datta et al., "Ultrahigh-Speed 0.5 V Supply Voltage In0.7Ga0.3As Quantum-Well Transistors on Silicon Substrate," 28 Electron Device Letters 8, 2007, pp. 685-687.
Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.
De Boeck et al., "The fabrication on a novel composite GaAs/SiO$_2$ nucleation layer on silicon for heteroepitaxial overgrowth by molecular beam Epitaxy," Material Science and Engineering, B9, 1991, pp. 137-141.
Donaton et al., "Design and Fabrication of MOSFETs with a Reverse Embedded SiGe (Rev. e-SiGe) Structure," 2006 IEDM, pp. 465-468.
Dong, Y., et al, "Selective area growth of InP through narrow openings by MOCVD and its application to InP HBT," 2003 International Conference on Indium Phosphide and Related Materials, May 12-16, 2003, pp. 389-392.
European Patent Office, Extended European Search Report and Search Opinion dated Jan. 26, 2011 in EP Patent Application No. 10003084.0-2203 (9 pages).
European Search Report issued by the European Patent Office on Dec. 15, 2010 in European Patent Application No. 10002884.4 (10 pages).
Examination Report in European Patent Application No. 06800414.2, mailed Mar. 5, 2009, 3 pages.
Fang et al., "Electrically pumped hybrid AlGaInAs-silicon evanescent laser," 14 Optics Express 20, 2006, pp. 9203-9210.
Feltin et al., "Epitaxial lateral overgrowth of GaN on Si (111)," Journal of Applied Physics, vol. 93, No. 1, Jan. 1, 2003, pp. 182-185.
Feng et al., "Integration of Germanium-on Insulator and Silicon Substrate," 27 Electron Device Letters 11, 2006, pp. 911-913.
Fiorenza et al., "Film Thickness Constraints for Manufacturable Strained Silicon CMOS," 19 Semiconductor Science Technology, 2004, p. L4.
Fischer et al., "Elastic stress relaxation in SiGe epilayers on patterned Si substrates," 75 Journal of Applied Physics 1, 1994, pp. 657-659.
Fischer et al., "State of stress and critical thickness of Strained small-area SiGe layers," Phys. Stat. Sol. (a) vol. 171, 1999, pp. 475-485.
Fitzgerald et al., "Elimination of Dislocations in heteroepitaxial MBE and RTCVD Ge$_x$Si$_{1-x}$ Grown on Patterned Si Substrates," Journal of Electronic Materials, vol. 19, No. 9, 1990, pp. 949-955.
Fitzgerald et al., "Epitaxial Necking in GaAs Growth on Pre-patterned Si Substrates," Journal of Electronic Materials, vol. 20, No. 10, 1991, pp. 839-853.
Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.
Fitzgerald et al., "Structure and recombination in InGaAs/GaAs heterostructures," 63 Journal of Applied Physics, vol. 3, 1988, pp. 693-703.
Fitzgerald et al., "Totally relaxed Ge$_x$Si$_{1-x}$ layers with low threading dislocation densities grown on Si Substrates," vol. 59, Applied Physics Letters 7, 1991, pp. 811-813.

Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.
Gallagher et al., "Development of the magnetic tunnel junction MRAM at IBM: From first junctions to a 16-Mb MRAM demonstrator chip," 50 IBM J. Research & Dev. 1, Jan. 2006, pp. 5-23A.
Gallas et al., "Influence of Doping on Facet Formation at the SiO$_2$/Si Interface," Surface Sci. 440, 1999, pp. 41-48.
Geppert, "Quantum transistors: toward nanoelectronics," IEEE Spectrum, Sep. 2000, pp. 46-51.
Gibbon et al., "Selective-area low-pressure MOCVD of GaInAsP and related materials on planar InP substrates," Semicond. Sci. Tech. vol. 8, 1993, pp. 998-1010.
Glew et al., "New DFB grating structure using dopant-induced refractive index step," J. Crystal Growth 261, 2004, pp. 349-354.
Golka, et al., "Negative differential resistance in dislocation-free GaN/AlGan double-barrier diodes grown on bulk GaN," 88 Applied Physics Letters 17, Apr. 2006, pp. 172106-1-172106-3.
Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.
Gould et al., "Magnetic resonant tunneling diodes as voltage-controlled spin selectors," 241 Phys. Stat. Sol. (B), vol. 3, 2004, pp. 700-703.
Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.
Gruber, et al., "Semimagnetic Resonant Tunneling Diodes for Electron Spin Manipulation," Nanostructures: Physics & Technology, 8th International Symposium, 2000, pp. 483-486.
Gustafsson et al., "Cathodoluminescence from relaxed Ge$_x$Si$_{1-x}$ grown by heteroepitaxial lateral overgrowth," Journal of Crystal Growth 141, 1994, pp. 363-370.
Hammerschmidt, "Intel to Use Trigate Transistors from 2009 on," EETIMES Online, available at: http://www.eetimes.com/showArticle.jhtml?articleID=189400035 (Jun. 12, 2006). 1 page.
Hasegawa, et al., "Sensing Terahertz Signals with III-V Quantum Nanostructures," Quantum Sensing: Evolution and Revolution from Past to Future, SPIE 2003, pp. 96-105.
Hayafuji et al., Japan, Journal of Applied Physics, vol. 29, 1990, pp. 2371.
Hersee et al., "The Controlled Growth of GaN Nanowires," Nano Letters, vol. 6, No. 8, 2006, pp. 1808-1811.
Hiramatsu et al., "Fabrication and characterization of low defect density GaN using facet-controlled epitaxial lateral overgrowth (FACELO)," Journal of Crystal Growth, vol. 221, Dec. 2000, pp. 316-326.
Hollander et al., "Strain and Misfit Dislocation Density in Finite Lateral Size Si$_{1-x}$Ge$_x$/Si Films Grown by Selective Epitaxy," Thin Solid Films, vol. 292, 1997, pp. 213-217.
Hu et al., "Growth of Well-Aligned Carbon Nanotube arrays on Silicon Substrates Using Porous Alumina Film as a Nanotemplate," 79 Applied Physics Letters 19, 2001, 3 pages.
Yanlong, et al., "Monolithically fabricated OEICs using RTD and MSM," Chinese Journal Semiconductors vol. 27, No. 4, Apr. 2006, pp. 641-645.
Huang et al., "Electron and Hole Mobility Enhancement in Strained SOI by Wafer Bonding," 49 IEEE Transactions on Electron Devices 9, 2002, pp. 1566-1570.
Ying-Long, et al., "Resonant tunneling diodes and high electron mobility transistors integrated on GaAs substrates," Chinese Physics Letters 23, vol. 3, Mar. 2006, pp. 697-700.
Hydrick et al., "Chemical Mechanical Polishing of Epitaxial Germanium on SiO$_2$-patterned Si(001) Substrates," ECS Transactions, 16 (10), 2008, (pp. 237-248).
Intel Press Release, "Intel's Tri-Gate Transistor to Enable Next Era in Energy-Efficient Performance," Intel Corporation (Jun. 12, 2006). 2 pages.

(56) References Cited

OTHER PUBLICATIONS

Intel to Develop Tri-Gate Transistors Based Processors, available at: http://news.techwhack.com/3822/tri-gate-transistors/ (Jun. 13, 2006) 6 pages.
International Preliminary Report on Patentability for International Application No. PCT/US2006/019152 mailed Nov. 29, 2007, 2 pages.
International Preliminary Report on Patentability for International Application No. PCT/US2006/029247 mailed Feb. 7, 2008, 12 pages.
International Preliminary Report on Patentability for International Application No. PCT/US2006/033859 mailed Mar. 20, 2008, 14 pages.
International Preliminary Report on Patentability for International Application No. PCT/US2007/019568 mailed Mar. 19, 2009, 10 pages.
International Preliminary Report on Patentability for International Application No. PCT/US2007/020181 mailed Apr. 2, 2009, 9 pages.
International Preliminary Report on Patentability for International Application No. PCT/US2007/020777 mailed Apr. 9, 2009, 12 pages.
International Preliminary Report on Patentability for International Application No. PCT/US2007/021023 mailed Apr. 9, 2009, 8 pages.
International Preliminary Report on Patentability for International Application No. PCT/US2007/022392 mailed Apr. 30, 2009, 14 pages.
Ipri et al., "MONO/POLY technology for fabricating low-capacitance CMOS integrated circuits," Electron Devices, IEEE Transactions, vol. 35, No. 8, Aug. 1988 pp. 1382-1383.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Depostion of Si1-xGex," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.

Kim et al., "GaN nano epitaxial lateral overgrowth on holographically patterned substrates," School of Physics and Inter-University Semiconductor Research Center, Seoul National University, Aug. 25-27, 2003, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.
Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.
Kollonitsch, et al., "Improved Structure and Performance of the GaAsSb/InP Interface in a Resonant Tunneling Diode," Journal of Crystal Growth, vol. 287, 2006, pp. 536-540.
Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9 pages.
Krost et al., "GaN-based Optoelectronics on Silicon Substrates," Materials Science & Engineering, B93, 2002, pp. 77-84.
Sudirgo et al., "Si-Based Resonant Interband Tunnel Diode/CMOS Integrated Memory Circuits," Rochester Institute of Technology, IEEE, 2006, pp. 109-112.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.
Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.
Kwok, "Barrier-Injection Transit Time Diode," Complete Guide to Semiconductor Devices, $2^{nd}$ ed., Chapter 18, 2002, pp. 137-144.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Langdo et al., "High Quality Ge on Si by Epitaxial Necking," Applied Physics Letters, vol. 76, No. 25, Jun. 19, 2000, pp. 3700-3702.
Langdo, "Selective SiGe Nanostructures," PhD Thesis, Massachusetts Institute of Technology, Jun. 2001, 215 pages.
Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.
Lee et al., "Strain-relieved, Dislocation-free $In_xGa_{1-x}As/GaAs(001)$ Heterostructure by Nanoscale-patterned Growth," Applied Physics Letters, vol. 85, No. 18, Nov. 1, 2004, pp. 4181-4183.
Li et al., "Defect Reduction of GasAs Epitaxy on Si (001) Using Selective Aspect Ratio Trapping," 91 Applied Physics Letters, 2007, pp. 021114-1-021114-3.
Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.
Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.
Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.
Li et al., "Selective Growth of Ge on Si (100) through Vias of $SiO_2$ Nanotemplate Using Solid Source Molecular Beam Epitaxy," Applied Physics Letters, vol. 83, No. 24, Dec. 15, 2003, pp. 5032-5034.
Liang et al., "Critical Thickness enhancement of Epitaxial SiGe films Grown on Small Structures," Journal of Applied Physics, vol. 97, 2005, pp. 043519-1-043519-7.
Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.
Liu et al., "High Quality Single-crystal Ge on Insulator by Liquid-phase Epitaxy on Si Substrates," Applied Physics Letters, vol. 84, No. 14, Apr. 4, 2004, pp. 2563-2565.

(56) References Cited

OTHER PUBLICATIONS

Liu et al., "Rapid Melt Growth of Germanium Crystals with Self Aligned Microcrucibles on Si Substrates," Journal of the Electrochemical Society, vol. 152, No. 8, 2005, pp. G688-G693.
Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.
Lourdudoss et al., "Semi-insulating epitaxial layers for optoelectronic devices," Semiconducting and Insulating Materials Conference, SIMC-XI, 2000, pp. 171-178.
Luan et al., "High-quality Ge Epilayers on Si with Low Threading-dislocation Densities," Applied Physics Letters, vol. 75, No. 19, Nov. 8, 1999, pp. 2909-2911.
Luan, "Ge Photodetectors for Si Microphotonics," PhD Thesis, Massachusetts Institute of Technology, Department of Materials Science & Engineering, Jan. 12, 2001, 155 pages.
Lubnow et al., "Effect of III/V-Compound Epitaxy on Si Metal-Oxide-Semiconductor Circuits," Japan, Journal of Applied Physics, vol. 33, 1994, pp. 3628-3634.
Luo et al., Enhancement of (In,Ga)N Light-Emitting Diode Performance by Laser Liftoff and Transfer From Sapphire to Silicon, IEEE Photonics Technology Letters, vol. 14, No. 10, 2002, pp. 1400-1402.
Luryi et al., "New Approach to the High Quality Epitaxial Growth of Latticed-Mismatched Materials," Applied Physics Letters, vol. 49, No. 3, Jul. 21, 1986, pp. 140-142.
Ma, et al., "A small signal equivalent circuit model for resonant tunneling diode," Chinese Physics Letters, vol. 23, No. 8, Aug. 2006, pp. 2292-2295.
Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.
Maekawa, et al., "High PVCR Si/Si1-x/Gex DW RTD formed with a new triple-layer buffer," Materials Science in Semiconductor Processing, vol. 8, 2005, pp. 417-421.
Maezawa, et al., "Metamorphic resonant tunneling diodes and its application to chaos generator ICs," 44 Jap. J. Applied Physics, Part 1, No. 7A, Jul. 2005, pp. 4790-4794.
Maezawa, et al., "InP-based resonant tunneling diode/HEMT integrated circuits for ultrahigh-speed operation," IEEE Nagoya University, Institute for Advanced Research, 2006, pp. 252-257.
Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.
Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.
Matthews et al., "Defects in Epitaxial Multilayers—Misfit Dislocations," Journal of Crystal Growth, vol. 27, 1974, pp. 118-125.
Monroy, et al., "High UV/visible Contrast Photodiodes Based on Epitaxial Lateral Overgrown GaN layers," Electronics Letters, vol. 35, No. 17, Aug. 19, 1999, pp. 1488-1489.
Nakano et al., "Epitaxial Lateral Overgrowth of AlN Layers on Patterned Sapphire Substrates," Source: Physica Status Solidi A, vol. 203, No. 7, May 2006, pp. 1632-1635.
Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.
Naoi et al., "Epitaxial Lateral Overgrowth of GaN on Selected-area Si (111) Substrate with Nitrided Si Mask," Journal of Crystal Growth, vol. 248, 2003, pp. 573-577.
Naritsuka et al., "InP Layer Grown on (001) Silicon Substrate by Epitaxial Lateral Overgrowth," Japan, Journal of Applied Physics, vol. 34, 1995, pp. L1432-L1435.
Naritsuka et al., "Vertical Cavity Surface Emitting Laser Fabricated on GaAs Laterally Grown on Si Substrate," Electrochemical Society Proceedings, vol. 97, No. 21, pp. 86-90.
Neudeck, et al., "Novel silicon Epitaxy for advanced MOSFET devices," Electron Devices Meeting, IEDM Technical Digest International, 2000, pp. 169-172.
Neumann et al., "Growth of III-V Resonant Tunneling Diode on Si Substrate with LP-MOVPE," Journal of Crystal Growth, vol. 248, 2003, pp. 380-383.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.
Noda, et al., "Current-voltage characteristics in double-barrier resonant tunneling diodes with embedded GaAs quantum rings," Physica E 32, 2006, pp. 550-553.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.
Parillaud et al., "High Quality InP on Si by Conformal Growth," Applied Physics Letters, vol. 68, No. 19, May 6, 1996, pp. 2654-2656.
Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.
Park et al., "Defect Reduction of Selective Ge Epitaxy in Trenches on Si (001) Substrates Using Aspect Ratio Trapping," Applied Physics Letters 90, 052113, Feb. 2, 2007, 3 pages.
Park et al., "Fabrication of Low-Defectivity, Compressively Strained Geon $Si_{0.2}G^e{}_{0.8}$ Structures Using Aspect Ratio Trapping," Journal of the Electrochemical Society, vol. 156, No. 4, 2009, pp. H249-H254.
Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.
Partial International Search for International Application No. PCT/US2006/033859 mailed Jun. 22, 2007, 7 pages.
Partial International Search Report for International Application No. PCT/US2008/004564 completed Jul. 22, 2009, mailed Oct. 16, 2009, 5 pages.
Partial International Search Report for International Application No. PCT/US2008/068377, completed Mar. 19, 2008, mailed Apr. 22, 2008, 3 pages.
PCT International Search Report of PCT/US2009/057493, from PCT/ISA/210, mailed Mar. 22, 2010, Applicant: Amberwave System Corporation et al., 2 pages.
Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.

(56) References Cited

OTHER PUBLICATIONS

Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-111901-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits, Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l SOI Conf., pp. 110-111.
Suhara, et al, "Characterization of argon fast atom beam source and its application to the fabrication of resonant tunneling diodes," 2005 International Microprocesses and Nanotechnology Conf. Di. of Papers, 2005, pp. 132-133.
Sun et al., Electron resonant tunneling through InAs/GaAs quantum dots embedded in a Schottky diode with an AlAs insertion layer, 153 J. Electrochemical Society 153, 2006, pp. G703-G706.
Sun et al., "Room-temperature observation of electron resonant tunneling through InAs/AlAs quantum dots," 9 Electrochemical and Solid-State Letters 5, May 2006, pp. G167-G170.
Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.

Sun et al., "Selective Area Growth of InP on InP Precoated Silicon Substrate by Hydride Vapor Phase epitaxy," Indium Phosphide and Related Materials Conference, IPRM. 14$^{th}$, 2002, pp. 339-342.
Sun et al., "Sulfur Doped Indium Phosphide on Silicon Substrate Grown by Epitaxial Lateral Overgrowth," Indium Phosphide and Related Materials 16$^{th}$ IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint 30$^{th}$ International Conference on Infrared and Millimeter Waves & 13$^{th}$ International Conference on Terahertz Electronics, 2005, pp. 150-151.
Takasuka et al., "AlGaAs/InGaAs DFB Laser by One-Time Selective MOCVD Growth on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SSOI) PMOS with Different Channel Orientations," IEEE, 2005, pp. 1-4.
Thelander, et al., "Heterostructures incorporated in one-dimensional semiconductor materials and devices," Physics of Semiconductors, vol. 171, 2002, 1 page. Abstract Only.
Thompson et al., "A Logic Nanotechnology Featuring Strained-Silicon," 25 IEEE Electron Device Letters 4, 2004, pp. 191-193.
Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.
Tomiya, "Dependency of crystallographic tilt and defect distribution of mask material in epitaxial lateral overgrown GaN layers," Applied Physics Letters vol. 77, No. 5, pp. 636-638.
Tran et al., "Growth and Characterization of InP on Silicon by MOCVD," Journal of Crystal Growth, vol. 121, 1992, pp. 365-372.
Tsai, et al., "InP/InGaAs resonant tunneling diode with six-route negative differential resistances," 13th European Gallium Arsenide and other Compound Semiconductors Application Symp., 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.
Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.

(56) References Cited

OTHER PUBLICATIONS

Ujiie, et al., Epitaxial Lateral Overgrowth of GaAs on a Si Substrate, 28, Japan, Journal of Applied Physics, vol. 3, Mar. 1989, pp. L337-L339.

Usuda et al., "Strain Relaxation of Strained-Si Layers on SiGe-on-Insulator (SGOI) Structures After Mesa Isolation," Applied Surface Science, vol. 224, 2004, pp. 113-116.

Usui et al., "Thick GaN Epitaxial Growth with Low Dislocation Density by Hydride Vapor Phase Epitaxy," vol. 36, Japan, Journal of Applied Physics, 1997, pp. L899-L902.

Vanamu et al., "Epitaxial Growth of High-Quality Ge Films on Nanostructured Silicon Substrates," Applied Physics Letters, vol. 88, 2006, pp. 204104.1-204-104.3.

Vanamu et al., "Growth of High Quality $Ge/Si_{1-x}Ge_x$ on Nano-scale Patterned Si Structures," J. Vac. Sci. Technology. B, vol. 23, No. 4, Jul./Aug. 2005, pp. 1622-1629.

Vanamu et al., "Heteroepitaxial Growth on Microscale Patterned Silicon Structures," Journal of Crystal Growth, vol. 280, 2005, pp. 66-74.

Vanamu et al., "Improving Ge $Si_xGe_{1-x}$ Film Quality through Growth onto Patterned Silicon Substrates," Advances in Electronics Manufacturing Technology, Nov. 8, 2004, pp. 1-4.

Vescan et al., "Lateral Confinement by Low Pressure Chemical Vapor Deposition-Based Selective Epitaxial Growth of $Si_{1-x}Ge_x/Si$ Nanostructures," No. 81, Journal of Applied Physics 10, 1997, pp. 6709-6715.

Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.

Walker, et al., "Magnetotunneling spectroscopy of ring-shaped (InGa)As quantum dots: Evidence of excited states with 2pz character," 32 Physica E 1-2, May 2006, pp. 57-60.

Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.

Ting, et al., "Modeling Spin-Dependent Transport in InAS/GaSb/AlSb Resonant Tunneling Structures," 1 J. Computational Electronics, 2002, pp. 147-151.

Watanabe, et al., "Fluoride resonant tunneling diodes on Si substrates," IEEE International Semiconductor Device Research Symp. Dec. 2005, pp. 177-178.

Wernersson et al., "InAs Epitaxial Lateral Growth of W Marks," Journal of Crystal Growth, vol. 280, 2005, pp. 81-86.

Williams et al., "Etch Rates for Micromachining Processing—Part II," Journal of Microelectromechanical Systems, vol. 4, 1996, pp. 761-778.

Williams et al., "Etch Rates for Micromachining Processing—Part II," Journal of Microelectromechnical Systems, vol. 5, No. 4, Dec. 1996, pp. 256-269.

Wu et al., "Enhancement-mode InP n-channel metal-oxide-semiconductor field-effect-transistors with atomic-layer-deposited Al2O3 dielectrics," Applied Physics Letters 91, 022108-022110 (2007).

Wu et al., Gross-Sectional Scanning/Tunneling Microscopy Investigations of Cleaned III-V Heterostructures, Technical report, Dec. 1996, 7 pages.

Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.

Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-161105-3.

Xie et al., "From Porous Si to Patterned Si Substrate: Can Misfit Strain Energy in a Continuous Heteropitaxial Film Be Reduced?" Journal of Vacuum Science Technology, B, vol. 8, No. 2, Mar./Apr. 1990, pp. 227-231.

Xu et al., "Spin-Filter Devices Based on Resonant Tunneling Antisymmetrical Magnetic Semiconductor Hybrid Structures," vol. 84, Applied Physics Letters 11, 2004, pp. 1955-1957.

Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.

Yamaguchi et al., "Defect Reduction Effects in GaAs on Si Substrates by Thermal Annealing," Applied Physics Letters vol. 53, No. 23, 1998, pp. 2293.

Yamaguchi et al., GaAs Solar Cells Grown on Si Substrates for Space Use: Prog. Photovolt.: Res. Appl., vol. 9, 2001; pp. 191-201.

Yamaguchi et al., "Super-High-Efficiency Multi-junction Solar Cells," Prog. Photovolt.: Res. Appl., vol. 13, 2005, pp. 125-132.

Yamamoto et al., "Optimization of InP/Si Heteroepitaxial Growth Conditions Using Organometallic Vapor Phase Epitaxy," Journal of Crystal Growth, vol. 96, 1989, pp. 369-377.

Yang et al., "High Performance CMOS Fabricated on Hybrid Substrate with Different Crystal Orientations," IEDM Tech. Dig., 2003, pp. 453-456.

Yang et al., "Selective Area Deposited Blue GaN-InGaN Multiple-quantum Well Light Emitting Diodes over Silicon Substrates," Applied Physics Letter, vol. 76, No. 3, Jan. 17, 2000, pp. 273-275.

Yili, et al., "Physics-based hydrodynamic simulation of direct current characteristics in DBRTD," 29 Chinese J. Electron Devices 2, Jun. 2006, pp. 365-368.

Yin et al., "Ultrathin Strained-SOI by Stress Balance on Compliant Substrates and FET Performance," 52 IEEE Trans. on Electron Devices 10, 2005, pp. 2207-2214.

Dong et al., "Selective area growth of InP through narrow openings by MOCVD and its application to inP HBT," Indium Phosphide and Related Materials, International Conference, May 12-16, 2003, pp. 389-392.

Yoon et al., "Selective Growth of Ge Islands on Nanometer-scale Patterned $SiO_2/Si$ Substrate by Molecular Beam Epitaxy," Applied Physics Letters, vol. 89, 2006, pp. 063107.1-063107.3.

Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.

Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.

Zang et al., "Nanoheteroepitaxial lateral overgrowth of GaN on nanoporous Si (111)," Applied Physics Letters, vol. 88, No. 14, Apr. 3, 2006, pp. 141925.

Zang et al., "Nanoscale lateral epitaxial overgrowth of GaN on Si (111)," Applied Physics Letters, vol. 87, No. 19 (Nov. 7, 2005) pp. 193106.1-193106.3.

Zela et al., "Single-crystalline Ge Grown Epitaxially on Oxidized and Reduced Ge/Si (100) Islands," Journal of Crystal Growth, vol. 263, 2004, pp. 90-93.

Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 7, 2001, pp. 812-816.

\* cited by examiner

DEVICES FORMED FROM A NON-POLAR PLANE OF A CRYSTALLINE MATERIAL AND METHOD OF MAKING THE SAME

This application is a continuation of U.S. patent application Ser. No. 12/753,049, filed on Apr. 1, 2010, and entitled "Devices Formed From a Non-Polar Plane of a Crystalline Material and Method of Making the Same," which is a continuation of and claims the benefit of co-pending International Application No. PCT/US10/29552, filed on Apr. 1, 2010, and entitled "DEVICES FORMED FROM A NON-POLAR PLANE OF A CRYSTALLINE MATERIAL AND METHOD OF MAKING THE SAME," which claims the benefit of U.S. Provisional Application No. 61/166,184, filed on Apr. 2, 2009, entitled "DEVICES FORMED FROM A NON-POLAR PLANE OF A CRYSTALLING MATERIAL AND METHOD OF MAKING THE SAME," which applications are hereby incorporated in their entireties herein by reference.

TECHNICAL FIELD

The present invention relates to devices formed from a non-polar plane of a crystalline material, such as the non-polar plane of a III-N crystalline material and methods of making the same. One embodiment is directed to non-polar LEDs or methods of making the same, or more particularly, non-polar LEDs from III-nitride semiconductor materials and methods of making the same.

BACKGROUND

This section provides background information and introduces information related to various aspects of the disclosure that are described and/or claimed below. These background statements are not admissions of prior art.

The usefulness of gallium nitride (GaN), and its ternary and quaternary compounds incorporating aluminum and indium (AlGaN, InGaN, AlInGaN), has been well established, for example, in the fabrication of visible and ultraviolet optoelectronic devices and high-power electronic devices. These devices are typically grown epitaxially using growth techniques including molecular beam epitaxy (MBE), CVD, metalorganic chemical vapor deposition (MOCVD), and hydride vapor phase epitaxy (HVPE).

As shown in FIG. 1, GaN and its alloys are most stable in the hexagonal wurtzite crystal structure, in which the structure is described by two (or three) equivalent basal plane axes that are rotated 120° with respect to each other (the a-axes), all of which are perpendicular to a unique c-axis. FIG. 1 illustrates an example c-plane 2, m-plane 4, and a-plane 6. Group III and nitrogen atoms occupy alternating c-planes along the crystal's c-axis. The symmetry elements included in the wurtzite structure dictate that III-nitrides possess a bulk spontaneous polarization along this c-axis, and the wurtzite structure exhibits piezoelectric polarization.

Current nitride technology for electronic and optoelectronic devices employs nitride films grown along the polar c-direction. However, related art c-plane quantum well structures in III-nitride (III-N) based optoelectronic and electronic devices suffer from the undesirable quantum-confined Stark effect (QCSE), due to the existence of strong piezoelectric and spontaneous polarizations. The strong built-in electric fields along the c-direction can significantly degrade the usefulness of these III-N materials.

One approach to eliminating the spontaneous and piezoelectric polarization effects in GaN optoelectronic devices is to grow the devices on non-polar planes, the m-planes and a-planes of the crystal. Such planes contain equal numbers of Ga and N atoms and are charge-neutral. Furthermore, subsequent non-polar layers are equivalent to one another so the bulk crystal will not be polarized along the growth direction. However, growth of GaN semiconductor wafers with a non-polar surface remains difficult. Accordingly, there exists a need to increase the efficiency and improve operating characteristics for III-nitride based optoelectronic and electronic devices, for example LEDs.

SUMMARY

One aspect of the present disclosure is to address problems or disadvantages of the related art or provide at least advantages described herein in whole or in part.

Another aspect of the present disclosure is to increase usage of a-plane and m-plane faces of crystalline materials, such as hexagonal or wurtzite structured crystal, in creating electronic devices.

Another aspect of the present disclosure is to increase the usage of non-polar faces of polar crystalline materials, such as III-N materials, and more particularly GaN, in creating electronic devices.

Another aspect of the present disclosure is to improve the extraction efficiency or the internal quantum efficiency of a semiconductor diode or light-emitting diodes (LEDs).

Another aspect of the present disclosure is to improve the extraction efficiency or the internal quantum efficiency of light-emitting diodes (LEDs) by using non-polar faces of III-N semiconductor crystalline material.

Another aspect of the present disclosure is to improve the extraction efficiency or the internal quantum efficiency of light-emitting diodes (LEDs) by exploiting non-polar planes of III-N semiconductors.

Embodiments according to the present invention provide methods, structures and apparatus that can provide a semiconductor diode or LED including at least an active diode region with more non-polar III-N semiconductor material than polar III-N semiconductor material.

Embodiments according to the present invention provide methods, structures and apparatus that can provide a semiconductor diode or an LED including bottom, active and top diode regions from a III-N semiconductor material where the active and top diode regions have fewer defects per unit area than the bottom diode region.

Embodiments according to the present invention provide methods, structures and apparatus that can provide a semiconductor diode or an LED including a cavity in a bottom diode material, an active diode region on a surface of the cavity and a top diode region in at least a portion of the cavity.

Embodiments according to the present invention provide methods, structures and apparatus that can use non-polar planes of III-N semiconductor material in an LED to increase an output efficiency.

These aspects may be especially applicable to devices incorporating III-N semiconductors, including but not limited to optoelectronic devices, a light emitting diode, a laser diode and a photovoltaic device.

Additional aspects and utilities of the invention will be set forth in part in the description which follows and, in part, will be obvious from the description, or may be learned by practice of the invention.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which.

DETAILED DESCRIPTION OF EMBODIMENTS

Figure 1:
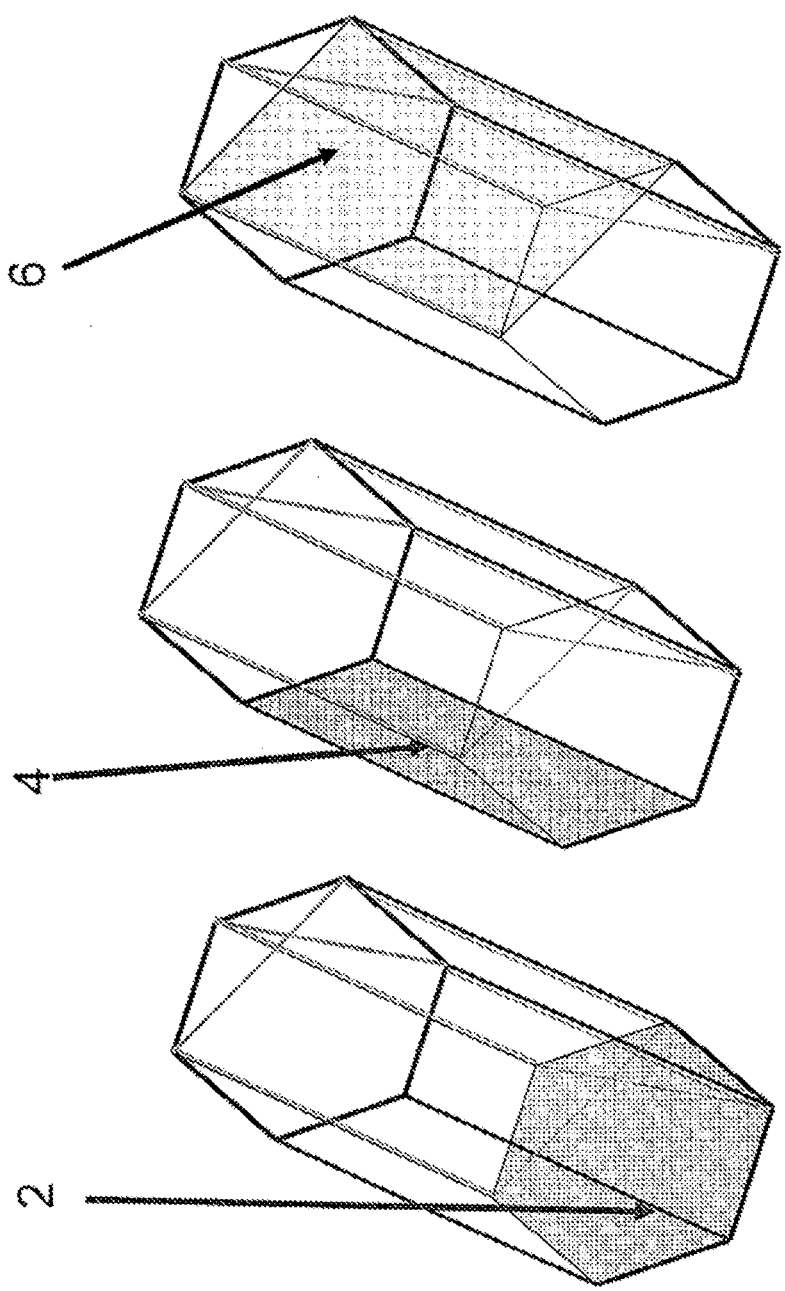
FIG. 1 is a diagram that illustrates an exemplary hexagonal crystal structure including c-planes, m-planes and a-planes.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Figure 2:
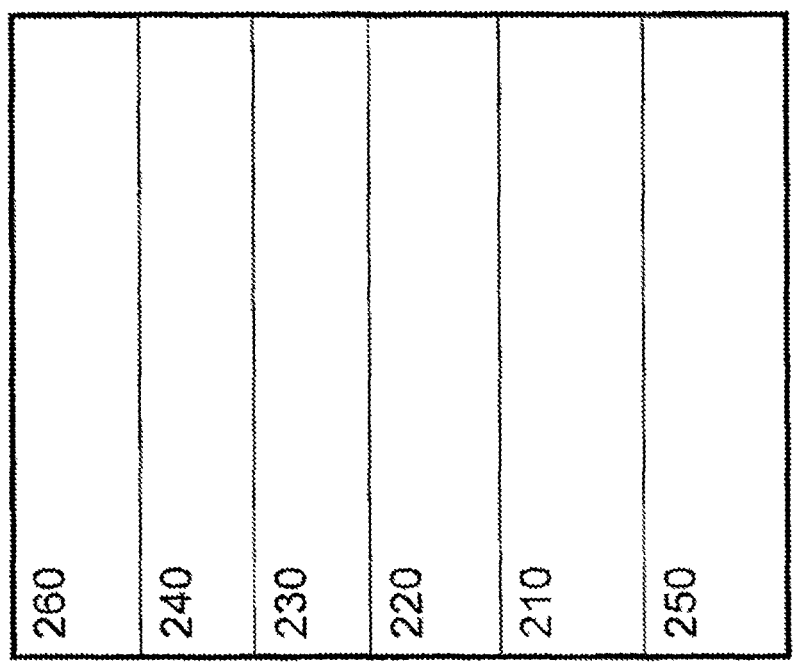
FIG. 2 is a diagram that illustrates an exemplary configuration of a semiconductor diode.

As shown in FIG. 2, a diode can include a bottom diode region 220, an active diode region 230 and a top diode region 240, a first electrical contact 260 on the top of the device and a second electrical contact 250 on the bottom of the device. Each region 220, 230, 240 can contain multiple layers. The diode can be coupled to a substrate 210. As shown in FIG. 2, in one embodiment the substrate 210 can be coupled between the bottom contact 250 and the active diode region 230. While FIG. 2 illustrates a vertical diode structure, it is emphasized the invention is not limited to such configurations and other structures and methods embodying the invention will be apparent to one of ordinary skill.

As used herein, "top" and "bottom" for designating regions is considered nonlimiting, a matter of convenience. For example, consider a diode formed above a substrate with its top region formed above its bottom region. If the diode is flip-chip bonded to a handle wafer and then the substrate is removed, the frame of reference for viewing the diode typically is flipped. In this case, the top region will be viewed as being below the bottom region.

The bottom diode region 220 and the top diode region 240 preferably have opposite doping types. For example, if the bottom diode region 220 is predominantly n-type doped (with an electron donor such phosphorous, arsenic, or antimony), then the top diode region 240 will be predominantly p-type doped (with an electron acceptor such as boron or aluminum), and vice versa. The bottom diode region 220 and the top diode region 240 are preferably heavily doped to improve device characteristics.

The bottom contact 250 electrically connects to the active diode region 230, for example, through a via (not shown). As another example, at least some portion of the substrate 210 can have the same predominant doping type (e.g., n or p) as the top diode region 240 or the bottom diode region 220. Accordingly, a good electrical contact can be made between such diode regions and the substrate 210.

Exemplary structures of the active diode region 230 can depend upon numerous factors, including an intended application of the diode and/or corresponding device. In an LED, the active diode region may be an intrinsic region. In an LED, the top diode region 240, the active diode region 230, and the bottom diode region 220 may be duplicated multiple times to include both doped layers and thin undoped quantum wells where electrons and holes can recombine and generate photons.

In another example of a laser, the active diode region 230 can be similar to that of an LED. Reflective layers would be added to create a resonant cavity for the generated light to create a coherent or substantially coherent light source.

In another example of a diode, the active diode region 230 may not be a separately grown layer but comprise the P-N junction interfacing between the top diode region and bottom diode region.

In another example of a solar cell, the active diode region 230 can be a single layer of moderately n-doped or moderately p-doped semiconductor material to absorb incident photons and generate an electron-hole pair.

The III-N compounds used to form the diode regions are well known to those of skill in the art. Group III-N compounds can include binary, ternary, and quaternary forms. Examples of III-N compounds include aluminum nitride (AlN), gallium nitride (GaN), indium nitride (InN), and their ternary and quaternary compounds. Those of skill in the art understand how to select and process these materials based on desired properties such as emitted light wavelength, bandgaps, lattice constants, doping levels, etc.

Figure 3:
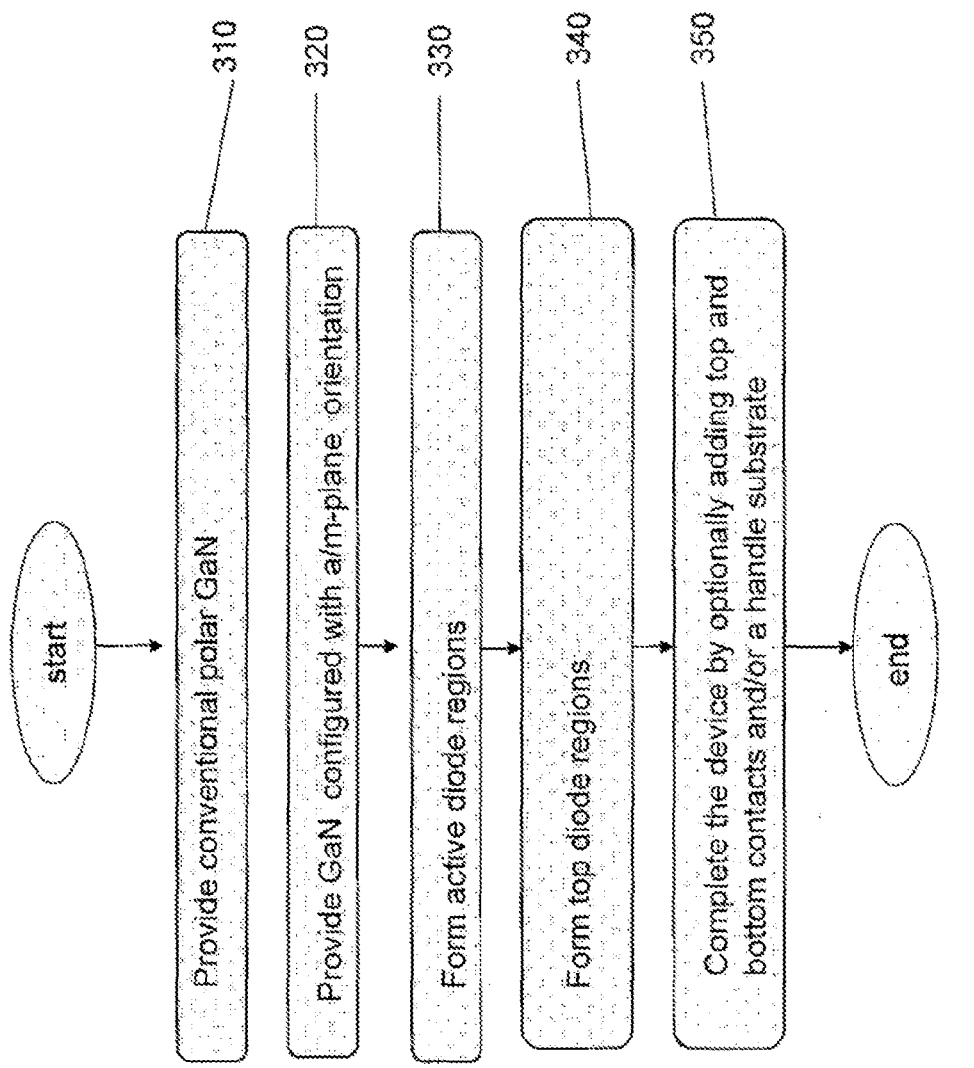
FIG. 3 is a flowchart illustrating an embodiment of a method for forming an embodiment of a semiconductor diode according to the invention.

FIG. 3 is a flowchart that illustrates an example method for making a LED. In this example, the LED is created from GaN crystalline material, but the invention should not be considered to be limited to such material. For example, the invention may be made from other polar materials or other polar III-N semiconductor materials. In this example, the active diode region is formed between surfaces of the top and bottom diode regions, much of or the majority of such surfaces being non-polar plane surfaces. In another example, the surfaces between which the active region is positioned include more non-polar m-plane III-N semiconductor faces than c-plane polar semiconductor faces. In another example, these surfaces include more non-polar a-plane III-N semiconductor faces than c-plane polar semiconductor faces. In another example, the surface area of the non-polar plane faces of these surfaces is at least double, 5 times, 10 times, 50 times or more than the surface area of polar c-plane semiconductor faces of these surfaces. In another example, the surfaces of the top and bottom diode regions between which the active diode region is formed is substantially all non-polar faces of a polar crystal material (e.g., one or both of the a-planes or m-planes of GaN or other III-N material). In another example, surfaces of the active region include more non-polar III-N semiconductor faces than c-plane polar semiconductor faces.

FIG. 3 illustrates an example process. As shown in FIG. 3, in step 310, a layer of GaN is provided. This may be a GaN bulk substrate, or a GaN grown or otherwise formed on a supporting physical substrate. Alternatively, it may be that GaN is selectively grown (as compared to blanket growth) within selected areas of a substrate as part of a larger semiconductor process. This selective growth may be within a confined area, such as within an ART opening or trench. In this example, a conventional bulk GaN substrate is provided with its surface constituting a polar face (c-plane). In this example, the first layer of GaN corresponds to a bottom diode region 220 of the subsequently formed LED. Caused by III-N semiconductor material characteristics, as generally grown, conventional bulk polar substrates have their "c-plane" parallel to the substrate.

In step 320, the GaN is configured to expose one or both of an a-plane or m-plane. For example, the GaN is vertically etched to form openings, such as holes or trenches in the surface of the GaN. The thus configured GaN corresponds to the bottom diode region of the device.

In step 330, active diode regions are formed. Depending on the device being created, this may be a separate step from step 340 (discussed below) or part of step 340. For example, if an LED is being formed with an intrinsic region, step 330 may include epitaxially growing undoped GaN on the surface of the GaN surface configured by step 320. As another example, if a diode is being formed, step 330 may be the initial part of step 340 to form the PN junction interface (e.g., including a depletion region).

In step 340, a top diode region is formed. For example, this step may include epitaxially growing GaN on the structure resulting from step 330, the GaN including a dopant of opposite type than the dopant of the GaN layer provided in step 310. For example, if the GaN layer provided in step 310 is doped with an n-type dopant, the GaN grown in step 340 may be doped with a p-type dopant. If the GaN layer provided in step 310 is doped with a p-type dopant, the GaN grown in step 340 may be doped with an n-type dopant.

In step 350, contacts are added to provide electrical connections to the top and bottom diode regions. Although the example method illustrated in FIG. 3 has steps 310 through 350 performed in a certain order, the invention should not be construed as limited to such order. As one alternative example, contacts may be formed at any point during the method (e.g., they may be formed on a separate physical substrate to which the diode regions are later connected).

Figure 4:
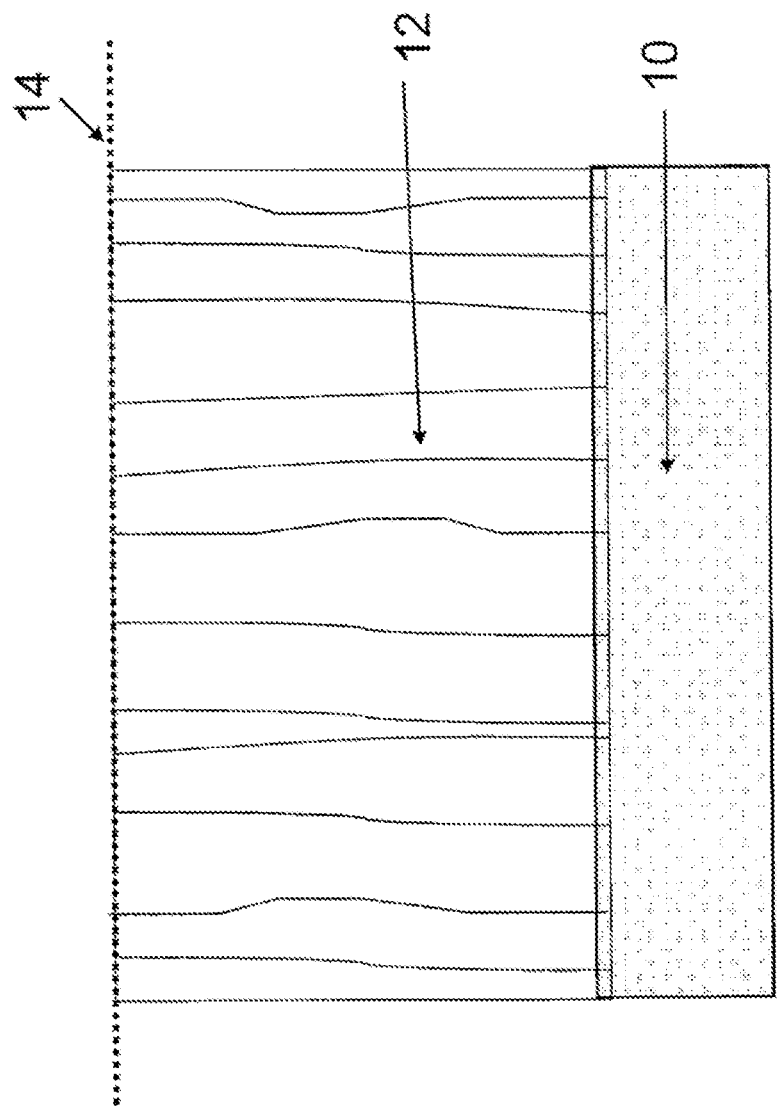
FIG. 4 is a diagram that illustrates a cross-sectional view of a related art GaN layer over a substrate.

FIG. 4 illustrates an example of a conventional bulk polar GaN layer 12. As shown in FIG. 4, the polar GaN layer 12 is formed on a sapphire wafer substrate 10, however, other materials for the substrate may be used, such as silicon or silicon carbide. The substrate 10 may be, for example, a bulk silicon wafer, a bulk germanium wafer, a semiconductor-on-insulator (SOI) substrate, or a strained semiconductor-on-insulator (SSOI) substrate. The substrate 10 may include or consist essentially of a first semiconductor material, e.g., sapphire. Orientation of the sapphire wafer substrate is typically (1,0,0), however, embodiments according to the application are not intended to be so limited. FIG. 4 also shows a c-plane 14 of the polar GaN layer 12.

Growth of GaN on sapphire is known in the art, but provides a crystalline material that is high in defects including primarily dislocation defects e.g., at least $10^9/cm^2$. However, as illustrated in FIG. 4 the majority of dislocation defects occur perpendicular or substantially vertical to the c-plane 14 of the III-N material. Accordingly, in one embodiment, a vertical sidewall in the bulk GaN material will have a lower number of defects (e.g., a vertical sidewall will intersect fewer defects per surface unit area than a horizontal surface).

Figure 5:
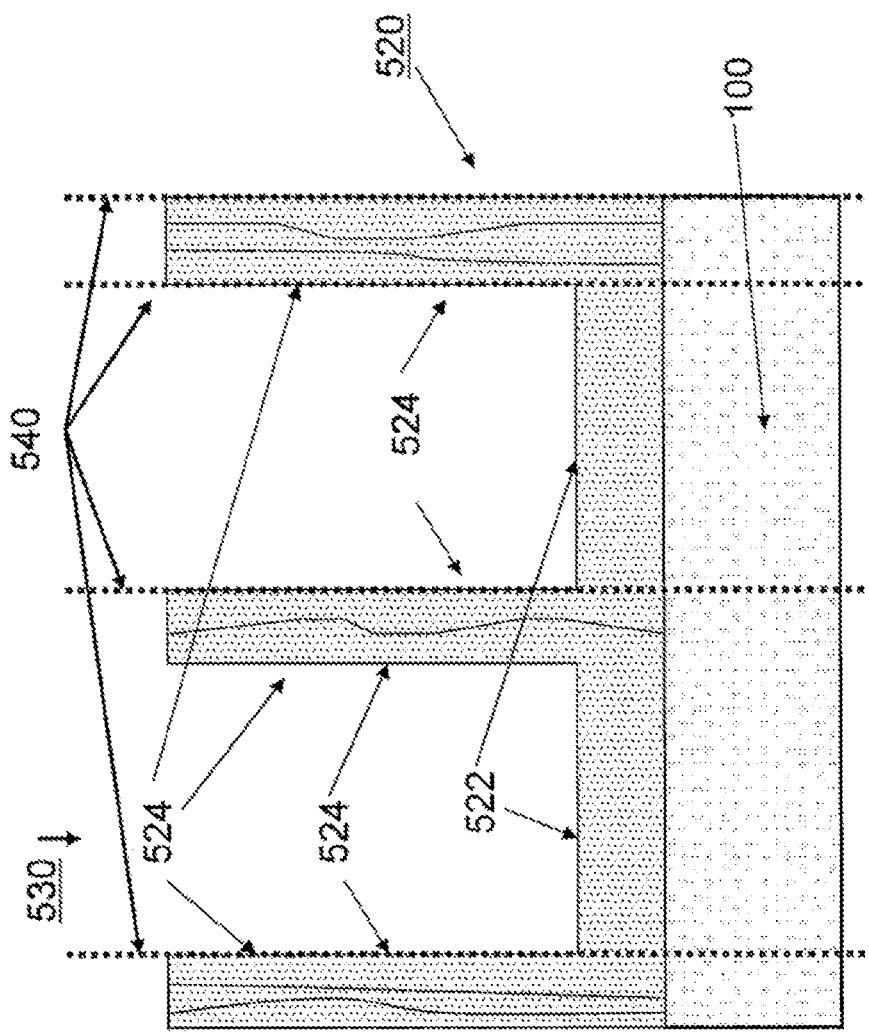
FIGS. 5-7 are diagrams that illustrate respective cross-sectional views of an exemplary device structure for a light emitting diode including III-N active regions using non-polar faces.

After the bulk GaN is provided, selected portions are removed to leave structures not oriented to the c-plane. For example, selected portions are removed to leave projections not oriented to the c-plane extending away from the top surface of the substrate. In one embodiment, projections are configured to use the m-plane or the a-plane of the GaN material (operation block 320). In one embodiment, projections are configured to not use the c-plane of the GaN material. For example, openings such as holes, recesses or cavities having prescribed dimensions (e.g., shapes) can be etched in to the bulk GaN. Such trenches can be formed using conventional photolithography techniques or reactive ion etching (RIE) processes. As illustrated in FIG. 5, an exemplary remaining structure 520 or projections can include first portions 524 (e.g., planar sides) that extend along the non-polar planes (e.g., m-planes or a-planes, collectively 540) of the crystalline material while selected portions 522 remain oriented to the c-plane. In one embodiment, the dimensions of the sides 524 are 2×, 5×, 10×, 20× or 100× larger than the portions 522. In one embodiment, the projections can be configured as fins or posts. In one embodiment, a bottom surface may have an intended configuration (e.g., an intended slope or prescribed profile such as a "v" shape).

As described above, an exemplary bottom diode region 220 can be doped in situ during epitaxial growth or ex situ by ion implantation. Again, the material for the bottom diode region preferably depends on the device.

In one embodiment, trenches 530 with substantially m-plane or a-plane sidewalls (e.g., vertical or horizontal sidewalls depending on an orientation) in the bulk GaN can be formed. The number of trenches may be 1 or more to even hundreds or more depending upon the desired application.

Figure 6:
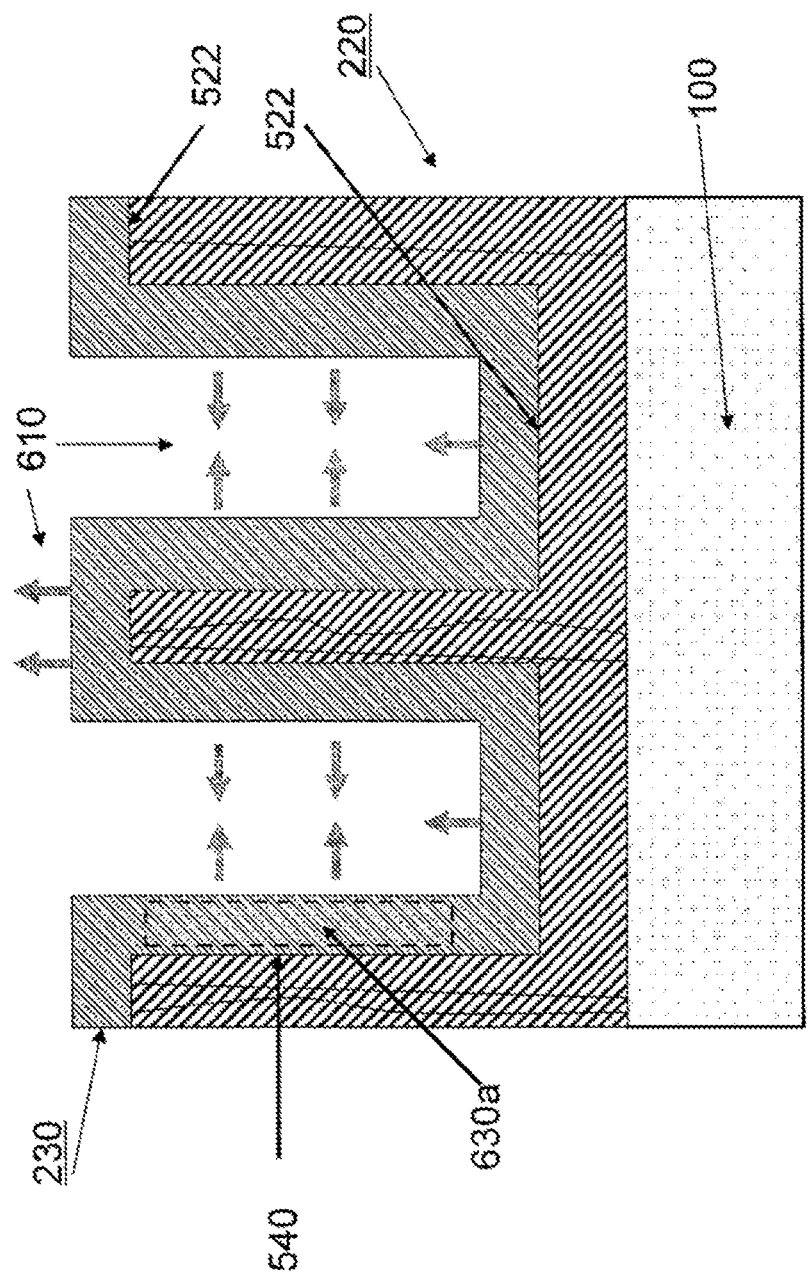

After the bottom diode region is configured, an active diode region is formed (operation block 330). In one embodiment, the active diode region can be epitaxially grown. As shown in FIG. 6, direction of exemplary epitaxial growth is indicated by the arrows 610. Growth of an active diode region 230 on exposed GaN surfaces on tops or bottoms or horizontal planes 522 of the projections can grow vertically. Growth of an active diode region 230 on exposed GaN surfaces on sides or vertical planes 524 of the projections can grow horizontally. An exemplary active diode region 230 can be doped in situ during epitaxial growth or ex situ by ion implantation. In one embodiment, the active diode region 230 is intrinsic (e.g., intrinsically doped).

In general, defects existing on an expitaxy growth surface tend to continue to create defects in material that is epitaxially grown from the defective growth surface. Extension of defects during epitaxial growth of the active diode regions is not shown in FIG. 6. However, since defects in GaN are predominantly vertical (see again FIGS. 4 and 5), the defects will tend to be parallel to sidewalls of the exposed projections. Many or most of the defects therefore will not intersect the sidewalls of the projections, and these sidewalls will have reduced or substantially defect free surfaces. Therefore, defectivity on the active diode region 230 shown in FIG. 6 grown on these sidewalls of the projections will also be reduced or substantially defect free. The defect density of the active diode region 230 grown on these sidewalls will be lower than that in the bottom diode region 220. As shown in FIG. 6, dashed region 630a in the active diode region 230 will have a defect density lower than that in the bottom diode region 220. According to one embodiment, defectivity in the active diode region 230 can be 2×, 5×, 10×, 20× or more lower than in the bottom diode region 220.

After the active diode region is configured, the top diode region is formed (operation block 340). In one embodiment, an exemplary top diode region 240 is epitaxially grown. Epitaxial growth for the top diode region 240 shown in FIG. 7 can be similar to that of the active diode region (e.g., epitaxial growth direction as indicated by the arrows 610 in FIG. 6). Growth of a top diode region 240 on exposed GaN surfaces (e.g., of the active diode region) on tops or bottoms or horizontal planes 522 of the projections can grow vertically.

Figure 7:
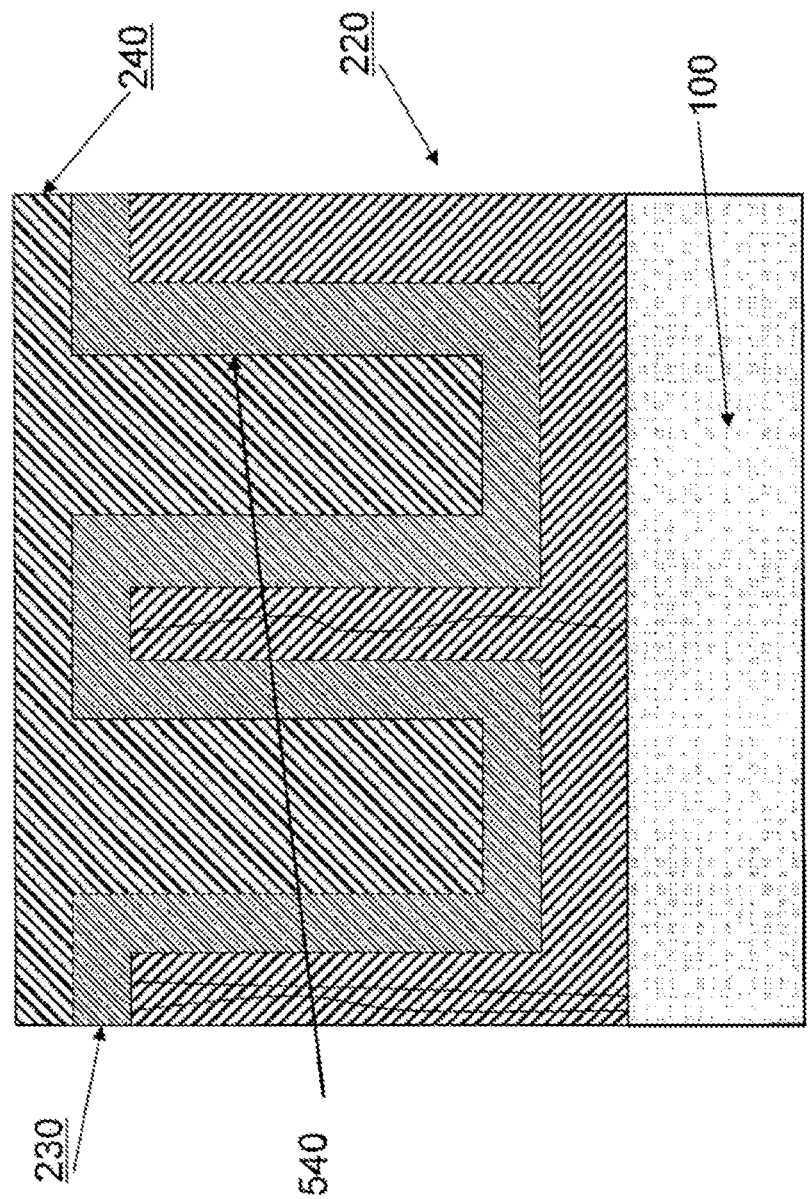

Growth of a top diode region 240 on exposed GaN surfaces on sides or vertical planes 524 of the projections can grow horizontally. One feature of the structure shown in FIG. 7 is that the top diode region 240 can partially (not shown) or completely fill an opening such as the opening 530 or an opening in the active diode region 230. One feature of the structure shown in FIG. 7 is that the top diode region 240 can fill multiple openings/trenches and makes electrical contact with active diode regions 230 in multiple openings/trenches. This architecture is particularly advantageous for LEDs because it can reduce or minimize the area of the top electrical contacts 260, which can block emission of the light generated within the active diode region 230. An exemplary top diode region 240 can be doped in situ during epitaxial growth or ex situ by ion implantation. Preferably, the top diode region 240 of the LED is heavily doped with an opposite type from the bottom diode region 220.

In one embodiment, defect levels in the top diode region are lower than in the bottom diode region. In one embodiment, defect levels in the top diode region are greater than in the active diode region. According to one embodiment, defectivity in the top diode region 240 can be 2×, 5×, 10×, 20× or more lower than in the bottom diode region 220.

In one embodiment, growth conditions for at least the active diode regions can be set or designed to favor horizontal growth from the m/a plane (e.g., 524 surfaces) over growth from the c-plane (e.g., 522 surfaces).

After the top diode region is completed, additional processing steps known in the art may optionally be employed to complete a corresponding semiconductor component, semiconductor device or semiconductor product (operation block 350). For example, top and bottom contacts can be added in some embodiments (operation block 350). In addition, some exemplary method embodiments can include bonding to a conductive wafer, bonding to a die or bonding to a package mounting point, removing the substrate and adding top and bottom contacts or the like.

Figure 8:
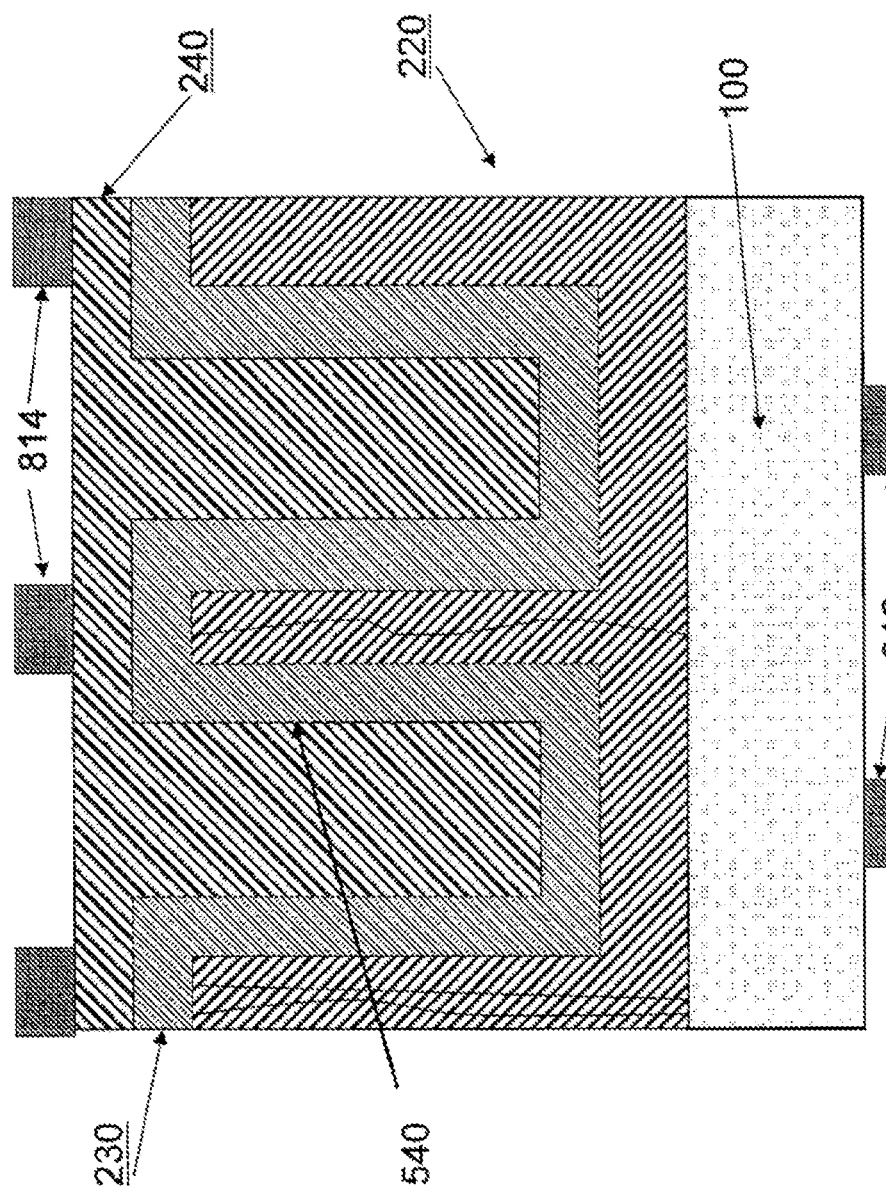
FIG. 8 illustrates a cross-sectional view of an embodiment of a semiconductor diode including III-N material active regions oriented to non-polar planes for use in an exemplary LED device.

After the top diode region 240 is configured, electrical contacts can be formed (operation block 350) as shown in FIG. 8. In one embodiment, an exemplary top electrical contact 814 and an exemplary bottom electrical contact 812 are provided to respectively directly contact the top and bottom diode regions 220, 240 for each opening/trench. Electrical contacts 812, 814 can be formed by various materials/processes known to one skilled in the art. Suitable materials for the electrical contacts can include, for example, materials such as a strip of conductive metal such as copper, silver, or aluminum, reflective conductive materials or a layer of relatively transparent conductive materials such as indium tin oxide. Further, there are many ways to couple the bottom contact 812 to the bottom diode region 220 though the substrate 100 such as contact vias (not shown) to make an electrically connection. The electrical contacts 812, 814 can operate as the top contact 260 and the bottom contact 250, respectively. In an alternative embodiment, a single contact (e.g., 812, 814) may be provided for a plurality of top diode regions 240 or a plurality of bottom diode regions 220 (e.g., in a plurality of openings/trenches).

Figure 9:
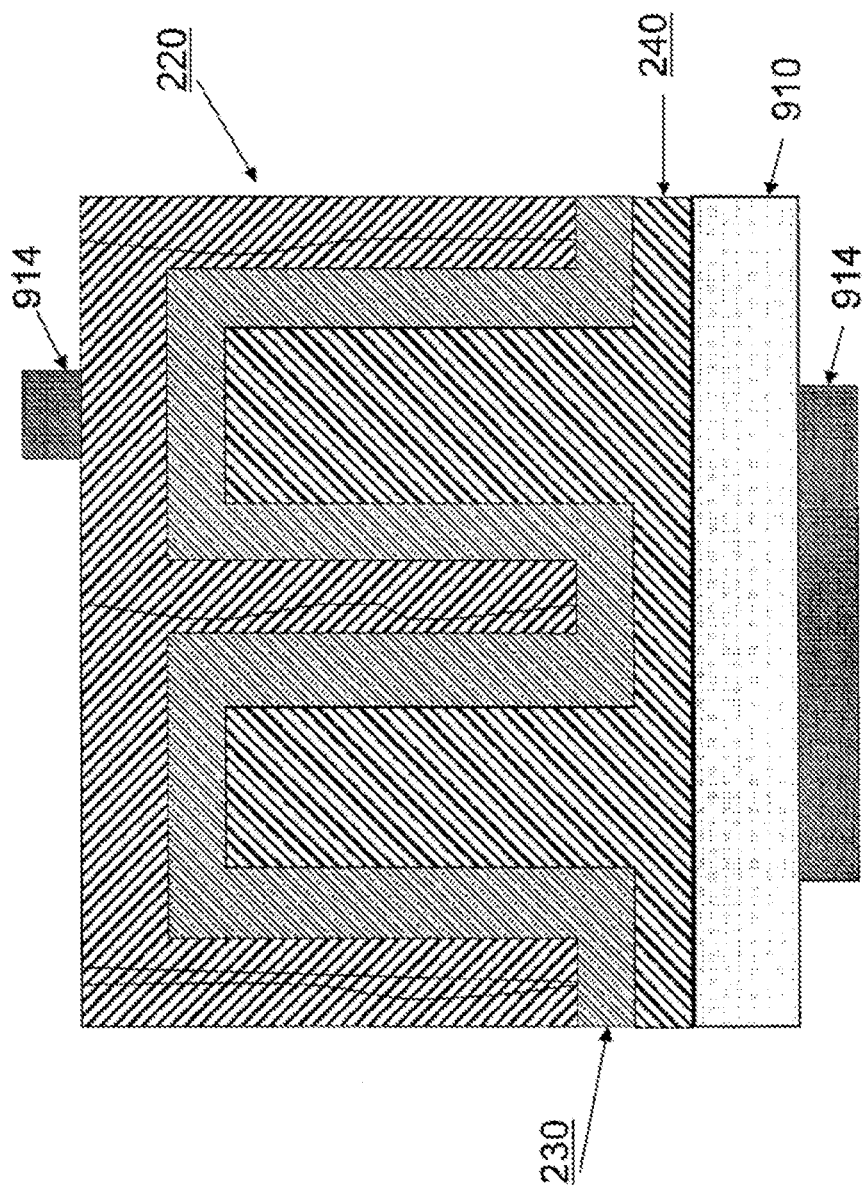
FIG. 9 illustrates a cross-sectional view of an embodiment of a semiconductor diode including III-N material active regions oriented to non-polar planes for use an in exemplary LED device.

For selected LED applications, the substrate 210 can degrade the performance of the device (e.g., absorb light). In one exemplary embodiment, a substrate can be removed as shown in FIG. 9. The substrate 210 (e.g., sapphire substrate) can be removed by well known methods in the art such grinding, etching, laser ablation or the like. An exemplary process (operation block 350) can include bonding a "handle" substrate or unit 910 to the top diode region 240 and adding electrical contacts 912, 914. Before bonding the handle substrate 910 to the top diode region 240, a corresponding surface of the top diode region 240 may be planarized by a suitable technique such as chemical mechanical planarization (CMP) to securely attach the handle substrate 910. Alternatively or in addition, a connection agent or layer (not shown) may be used to securely electrically connect the handle substrate 910 to the top diode region 240. Alternatively or in addition, an adhering agent or glue layer (not shown) may be used to securely bond the handle substrate 910 to the top diode region 240.

Then, the top contacts 260 and the bottom contacts 250 can be added by standard techniques. As shown in FIG. 9, one top electrical contact 914 and one bottom electrical contact 912 can be provided for two or more openings/trenches or active diode regions 230 in a corresponding opening/trench. Alternatively, the handle substrate 910 may be electrically conductive. In one embodiment, the handle substrate 910 can include or integrate the top contacts 914 for the top diode region 240. Further, the handle substrate 910 can include or be coupled to a device or package.

In related art LEDs, one factor limiting internal quantum efficiency is that the polar c-plane of GaN faces the active region. The exemplary method embodiment shown in FIG. 3 and/or exemplary embodiments shown in FIGS. 8-9 can deliver higher internal quantum efficiency because non-polar m-planes or a-planes of GaN face the active diode region. Further, such embodiments can provide LED structures with less c-plane polar oriented GaN material for one or more of the bottom diode region 220, the active diode region 230 and/or the top diode region 240.

In one embodiment, non-polar m-planes or a-planes of GaN can form an interface between the bottom diode region 220 and the active diode region 230. In one embodiment, non-polar m-planes or a-planes of GaN can form an interface between the active diode region 230 and the top diode region 240.

Figure 10A:
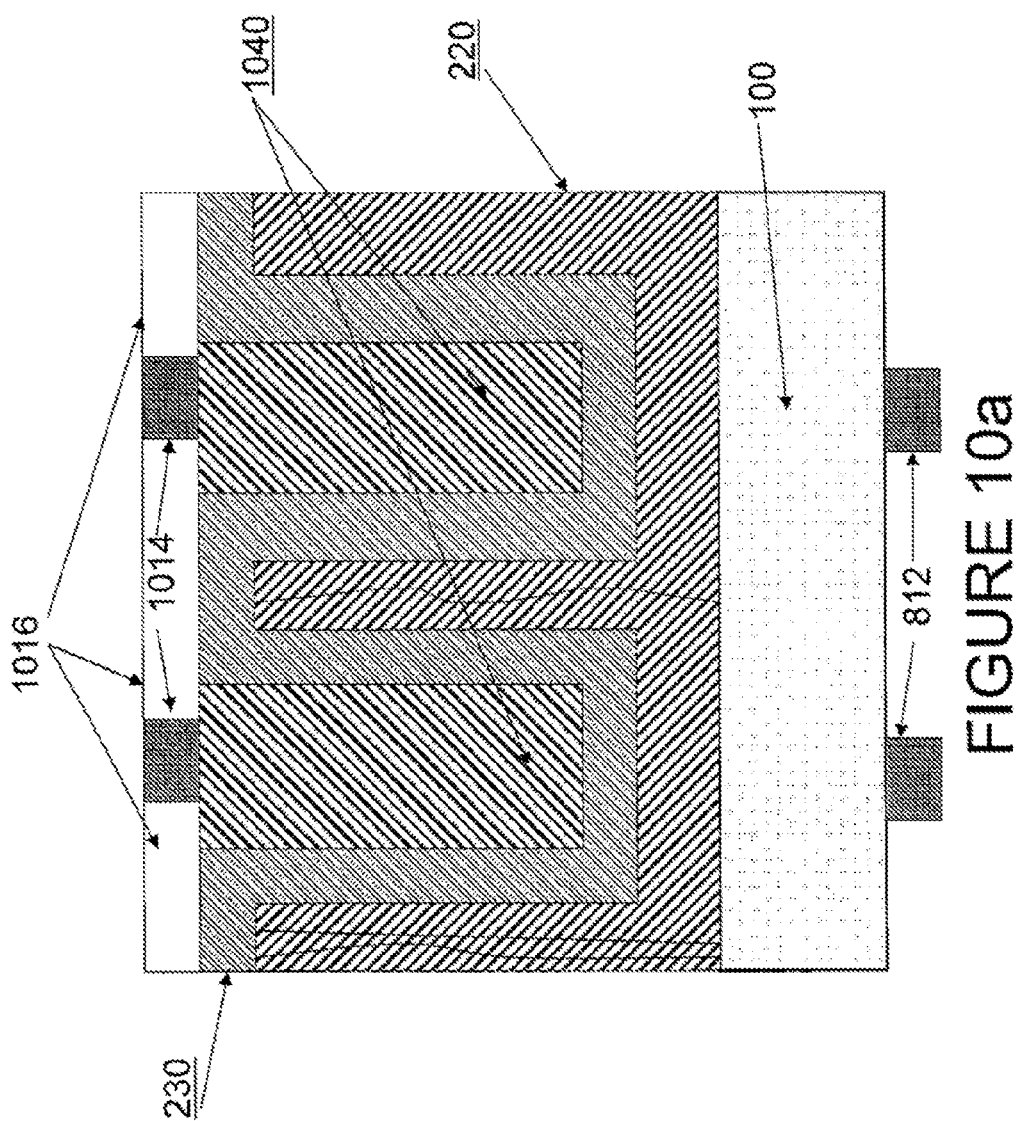
FIGS. 10a-10d illustrate a cross-sectional view of various embodiment of semiconductor diodes including non-polar III-N active regions for use an in exemplary LED device.
Figure 10B:
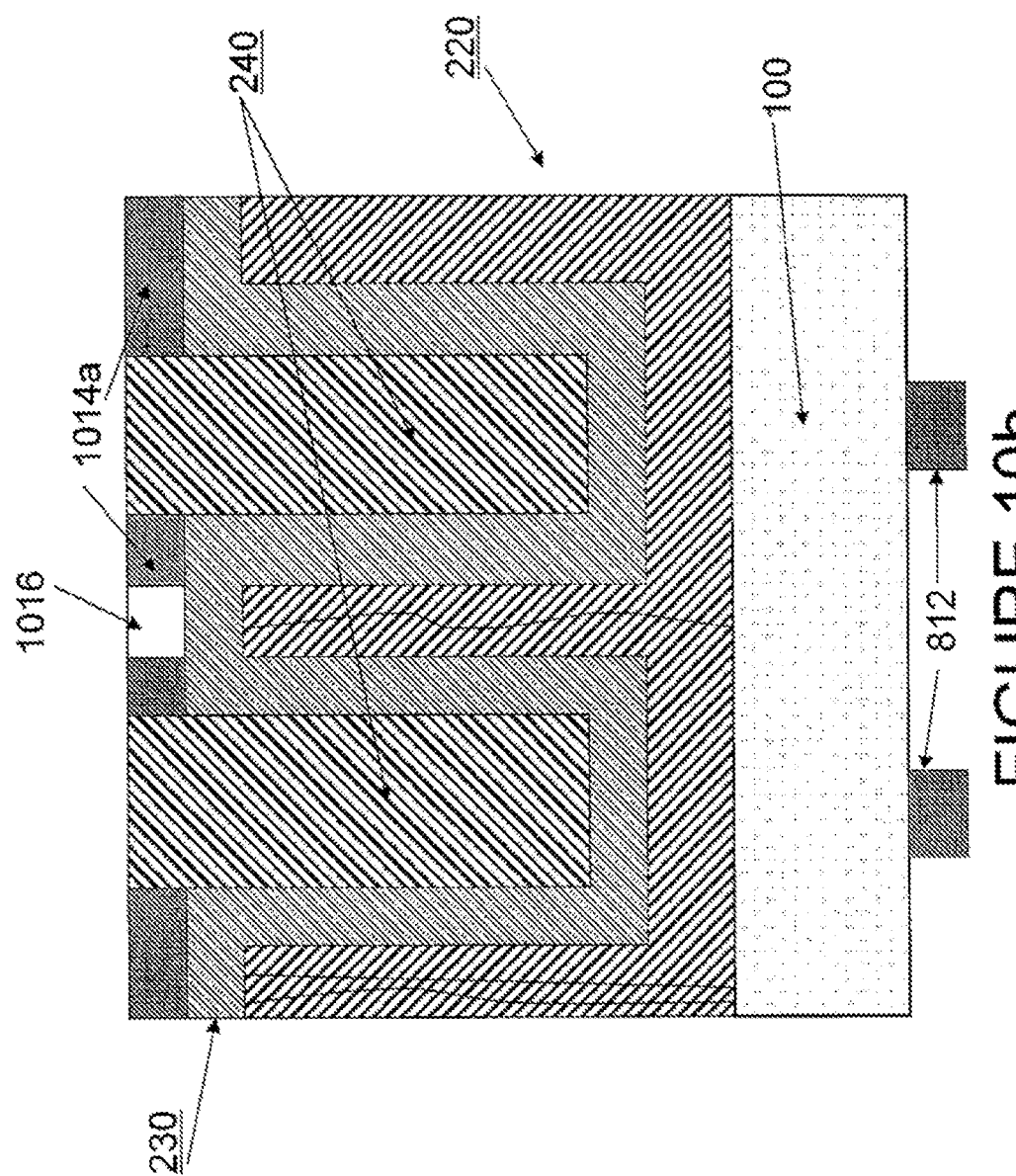

For selected embodiments according to the application, it may be desirable to increase a percentage of non-polar plane GaN to polar plane GaN in a corresponding device. In one exemplary embodiment, portions of non-polar plane GaN can be increased relative to polar GaN by relatively increasing a dimension of sidewall 524 or decreasing a dimension of bottom surface 522. In one exemplary embodiment, portions of non-polar plane GaN can be increased relative to polar plane GaN by removing selected portions of the polar GaN material during fabrication. FIGS. 10a-10b are a diagram that illustrates an exemplary configuration of a semiconductor diode. As shown in FIG. 10a, portions containing polar c-plane GaN in the top diode region 1040 can be reduced or removed. Removal of a top surface indicated in FIG. 10a stopped at the top diode region, however embodiments are not intended to be so limited, for example, GaN material removal could continue into the active diode region. As shown in FIG. 10b, portions containing polar c-plane GaN in the top diode region 1040 can be reduced or replaced with top contacts 1014. Reference number 1016 indicates a planarizing layer such as an insulator.

Figure 10C:
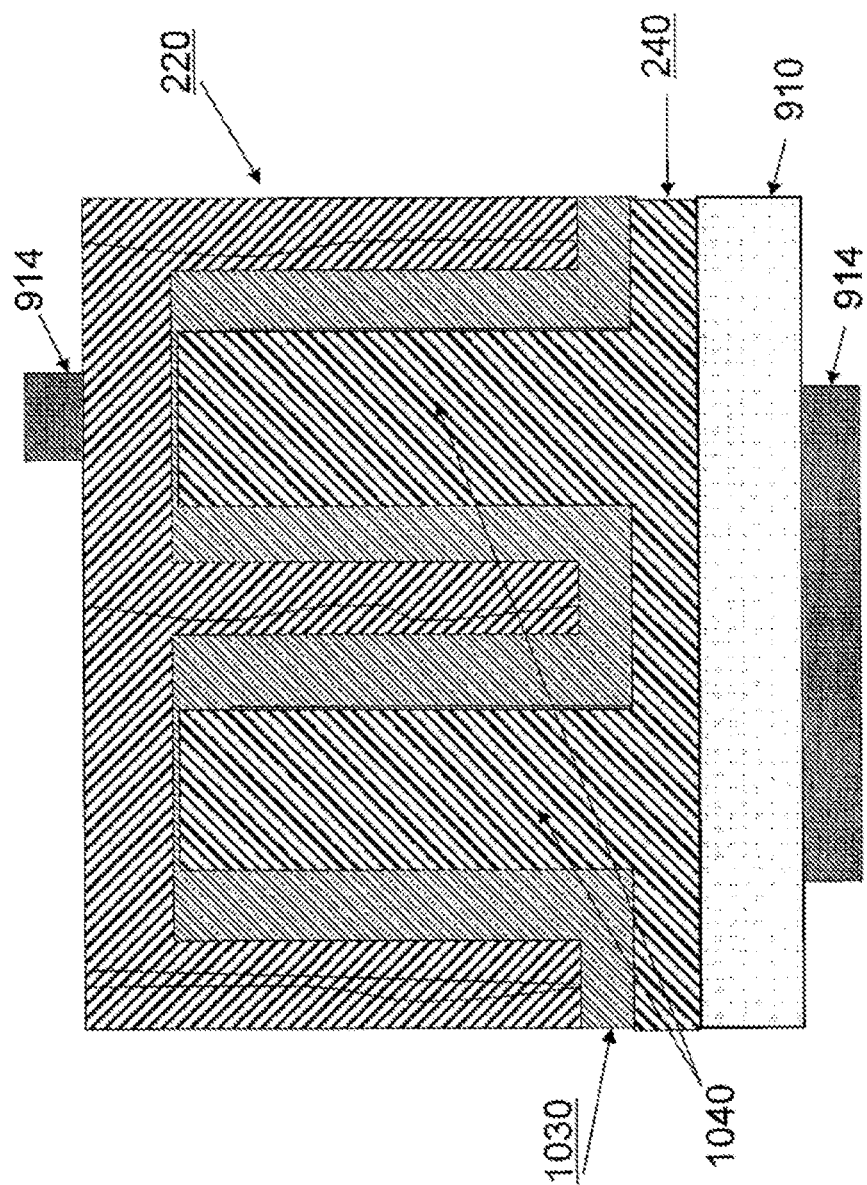
Figure 10D:
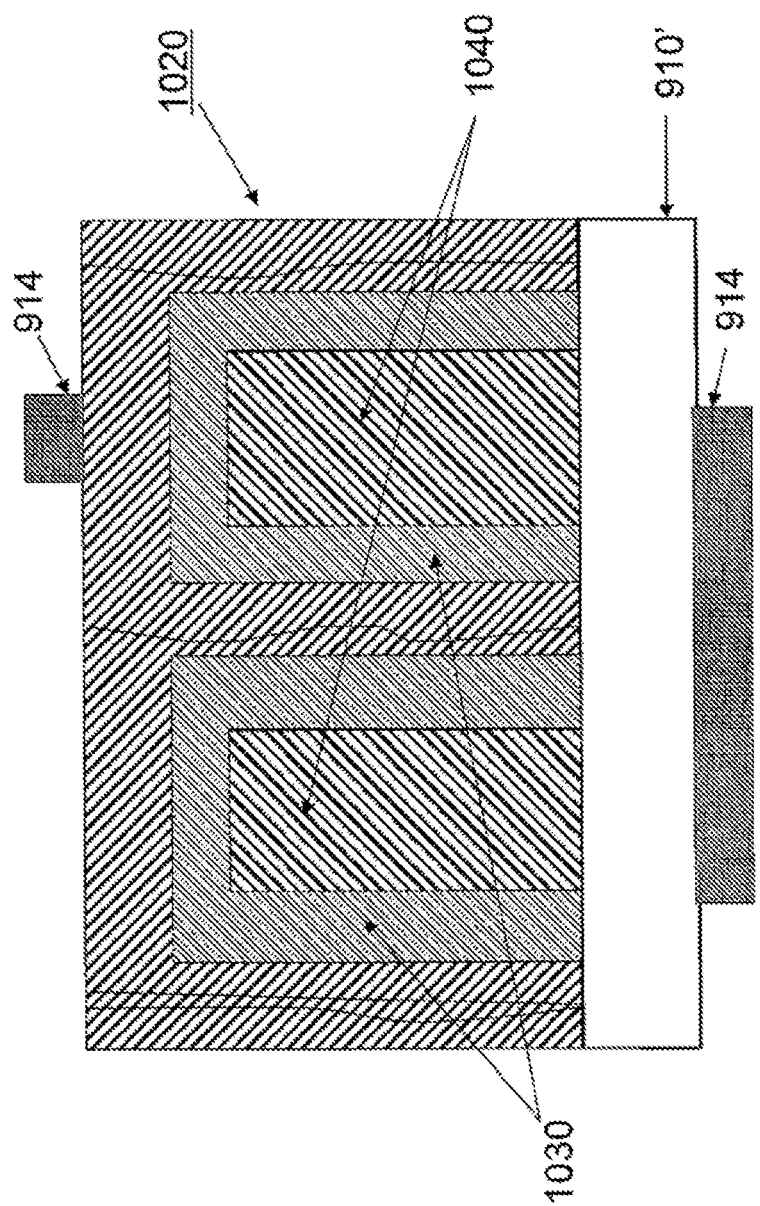

In one exemplary embodiment, portions of non-polar plane GaN can be increased relative to polar plane GaN by reducing or removing selected portions of the polar plane GaN material during fabrication. FIG. 10c is a diagram that illustrates an exemplary configuration of a semiconductor diode where portions containing polar plane GaN of an active diode region 1030 are removed prior to formation of the top diode region 1040. FIG. 10d is a diagram that illustrates an exemplary configuration of a semiconductor diode where polar plane GaN portions of a bottom diode region 1020, the active diode region 1030 and/or the top diode region are reduced or removed prior to formation of a "handle" substrate or unit 910'. In one embodiment, substantially all polar plane GaN material grown in the c-plane can be eliminated (e.g., removed) from a depletion region, active diode region or semiconductor diode.

Further, in selected embodiments, top contacts and/or bottom contacts can be 2D or 3D configured to reduce light impinging on polar GaN material in at least one of a bottom diode region, an active diode region or a top diode region.

In one embodiment of an LED, a bottom electrical contact (e.g., 220) can be a highly reflective conductive material that can reflect the internally created light so it will exit the LED from a selected surface or a desired surface. For example, a reflective bottom electrical contact can be made from materials such as such as silver. In another embodiment, such a reflective bottom electrode can be used in conjunction with a light transmissive substrate or an optically translucent/transparent substrate.

In one embodiment of an LED, a reflective layer can be incorporated adjacent selected ones of the bottom diode region 220, the active diode region 230 and/or the top diode region 240 to direct internally created light to exit the LED from a selected surface or a desired surface. For example, a reflective layer can be directly between a bottom diode region 220 and the substrate 210. The reflective layer can be formed by suitable materials/processes known to one skilled in the art.

One embodiment of a semiconductor diode can include a first region having a first dopant type, an active region and a second region having a second dopant type opposite to the first dopant type and an active region between the first and second regions. The active region is at a non-polar plane surface of the first or second region or between at least one non-polar plane surface of the first and second regions. Thus, the semiconductor diode can have a horizontal or vertical stacked structure. A ratio of non-polar surfaces/polar surfaces of the first region adjacent the active region is greater than 1. In one embodiment, at least the active region is a III-N crystalline material. In one embodiment, the active region is a pn junction or a depletion region of a pn junction. In one embodiment, the active region is an intrinsic region or a quantum well structure between the first and second regions. In this disclosure, a depletion region can be one type of active diode region or active region. First and second contacts can be correspondingly provided to the first and second regions.

The wavelength of the light emitted, and therefore its color, depends on the band gap energy of the materials forming the p-n junction of an LED. LEDs incorporating III-N material can emit light including blue, green, infrared, ultraviolet and white (e.g., based on or incorporating a blue light). For example, blue LEDs can be based on the wide band gap semiconductors GaN (gallium nitride) and InGaN (indium gallium nitride). In conventional LEDs, one factor limiting internal quantum efficiency is that the polar c-plane of the GaN. Internal efficiency decrease of an active region or a corresponding LED device can vary by the color/wavelength of the light emitted. In one embodiment, a green light emitting LED is expected to experience an increase in efficiency over 100 times. In one embodiment, a green light emitting LED is expected to experience an increase in efficiency over 2×, over 5×, over 10× or more.

In one embodiment of a blue light LED or a white light LED according to the application, an efficiency can be more than 2 times greater, more than 5 times greater, more than 10 times greater, more than 25 times greater or more because of non-polar III-N semiconductor crystalline material.

In one embodiment of an infrared light LED according to the application, an efficiency can be more than 2 times greater, more than 5 times greater, more than 10 times greater, more than 25 times greater or more because of non-polar III-N semiconductor crystalline material.

In one embodiment of an ultraviolet light LED according to the application, an efficiency can be more than 2 times greater, more than 5 times greater, more than 10 times greater, more than 25 times greater or more because of non-polar III-N semiconductor crystalline material.

In one exemplary embodiment, doping levels of the top and bottom diode regions may be in the range of $10^{17}$-$10^{20}$ cm$^{-3}$, and a doping level of the active region may be below $10^{17}$ cm$^{-3}$.

Lasers LEDs can suffer from disadvantages caused by using polarized material including at least an undesirable frequency shift and/or loss of efficiency. Such disadvantages can be reduced according to embodiments of the application.

Although exemplary embodiments were described using GaN, it is understood that any III-N semiconductor compound material may be used. According to embodiments of the invention, a III-N crystalline semiconductor material may be provided (e.g., selective epitaxial growth). In some embodiments, growth along a first direction of the III-N crystalline semiconductor material can be encouraged or growth along a second direction can be discouraged. In some embodiments, growth of non-polar plane III-N crystalline semiconductor material can be encouraged over polar plane III-N crystalline semiconductor material. In some embodiments, a-plane/m-plane oriented III-N crystalline semiconductor material can be encouraged and/or c-plane oriented III-N crystalline semiconductor material can be discouraged.

Although embodiments were described using non-polar planes, it is understood that any orientation that can reduce or eliminate the characteristic disadvantages of c-plane III-N semiconductor materials can be used (e.g., semi-planar, semi-polar).

Exemplary semiconductor diodes may be described in the context of a single diode or active diode region; however, one skilled in the art will understand that most applications require multiple diodes, typically integrated on a single chip. If a plurality of such semiconductor components, devices or products are formed for a single device or on a single chip, preferably they have identical electrically configurations and substantially identical performance.

As noted above, this invention has a wide variety of applications. While not limited to LED technology, this invention has many applications within LED technology.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

Below is a list of some embodiments:

(1) A method of making a diode comprises forming a first cladding layer including one or more fins of polar crystalline material, wherein major faces of the one or more fins are non-polar; forming an active region over one or more of said major faces; and forming a second cladding layer adjacent to said active region.

(2) A method of making a diode comprises providing a first cladding layer of a polar semiconductor crystalline material including a first surface with one or more holes formed therein, sidewalls of the one or more holes being non-polar faces of the polar semiconductor crystalline material; providing a second cladding layer opposite the first surface; and providing an active region interposed between the first and second cladding layers extending at least partially into the one or more holes.

(3) A method of making a diode comprises forming a first diode region; forming an active region adjacent the first diode region; and forming a second diode region adjacent the active region, wherein an area of one or more surfaces of the first diode region adjacent the active region that are non-polar is greater than an area of one or more surfaces of the first diode region that are polar.

(4) A method of making a light emitting diode comprises providing a first diode region; forming an active diode region adjacent the first diode region; and forming a second diode region adjacent the active diode region, wherein at least a portion of the active diode region and the second diode region correspond to a non-polar plane of the III-N semiconductor crystalline material.

(5) A method of making a light emitting diode comprises providing a bottom diode region from a III-N semiconductor material; forming an active diode region from a III-N semiconductor material adjacent the bottom diode region; and forming a top diode region from a III-N semiconductor material adjacent the active diode region, wherein the active and top diode regions have fewer defects per unit area than the bottom diode region.

(6) A method of making a light emitting diode comprises providing a bottom diode material; forming a cavity in the bottom diode material; forming an active diode region on a surface of the cavity; and depositing a top diode material in the cavity.

(7) A method of making a light emitting diode comprises providing bottom, active and top diode regions from III-N semiconductor material; and providing non-polar III-N semiconductor material in the LED to increase an output efficiency to over a prescribed amount.

(8) A method of making a light emitting diode comprises providing III-N semiconductor crystalline layer on a polar plane; forming a bottom diode region having at least one first surface aligned in a non-polar plane and at least one second surface aligned in a polar plane of the III-N semiconductor material layer; forming an active diode region adjacent the at least one first surface and the at least one second surface of the bottom diode region; and forming a top diode region adjacent the active diode region.

(9) A method of making a light emitting diode comprises providing a bottom diode region of III-N semiconductor material; forming an active diode region adjacent the bottom diode region on a non-polar surface of III-N semiconductor material; and forming a top diode region adjacent the active diode region.

(10) A method of making a light emitting diode comprises providing a first diode region; forming an active diode region adjacent the first diode region; and forming a second diode region adjacent the active diode region, wherein a first portion of the active diode region has a first output light efficiency and a second portion of the active diode region has a second lower output light efficiency.

The above-listed embodiments may each be further modified according to the features described below.

At least one of the active and top diode regions may have more total line defects than the bottom diode region.

A light output efficiency in a blue light LED may be more than 2 times greater, more than 5 times greater, more than 10 times greater, or more than 25 times greater. A light output efficiency in a green light LED may be more than 2 times greater, more than 5 times greater, more than 10 times greater, or more than 25 times greater. A light output efficiency in a white light LED may be more than 2 times greater, more than 5 times greater, more than 10 times greater, or more than 25 times greater. A light output efficiency in a ultraviolet light LED may be more than 2 times greater, more than 5 times greater, more than 10 times greater, or more than 25 times greater. A light output efficiency in an infrared light LED may be more than 2 times greater, more than 5 times greater, more than 10 times greater, or more than 25 times greater.

A ratio of non-polar surface area in the bottom diode region facing the active region to polar-plane surface area may be more than one. A ratio of non-polar surface area in the bottom diode region facing the active region to polar-plane surface area may be more than 2, more than 4, more than 10 or more than 50.

The active region may be III-N semiconductor material corresponding to a non-polar surface. A portion of the active diode region oriented to a polar surface of III-N semiconductor material may be less than 50%, less than 25%, less than 15%, less than 10% or less than 5%. A portion of the top diode region oriented to a polar surface of III-N semiconductor material may be less than 50%, less than 25%, less than 15%, less than 10% or less than 5%. A portion of the active diode region, the bottom diode region or the top diode region oriented to a polar surface of III-N semiconductor material may be less than 50%, less than 25%, less than 15%, less than 10% or less than 5%. A portion of the active diode region, the bottom diode region or the top diode region oriented to a non-polar surface of III-N semiconductor material may be greater than 50%, greater than 75%, greater than 85% or greater than 95%.

The diode regions may include one or more of the following: aluminum nitride (AlN), gallium nitride (GaN), indium nitride (InN), and their ternary and quaternary compounds. The diode regions may include GaN.

The bottom region may be configured with an opening, wherein the opening is a trench, recess or hole. A semiconductor device may be configured over at least a part of the opening. The trench may be at least 2 times deeper than its width, at least 5 times deeper than its width, at least 10 times deeper than its width or the trench may be at least 100 times deeper than its width. The trench may be at least 10 times longer than its width or the trench may be at least 100 times longer than its width. The width of the openings may be one of 450 nm or less, 400 nm or less, 350 nm or less, 200 nm or less, 100 nm or less and 50 nm or less. The width of the openings may be one of 5 um or less, 2 um or less and 1 um or less.

A CMOS device may be integrated with a substrate. A substrate may comprise silicon, germanium or sapphire. A surface of the substrate exposed in the insulator pattern opening may be a (100) surface of the silicon substrate, and the substrate may be a single crystal substrate or a polycrystalline substrate.

The diode regions may be epitaxially grown. The bottom, active and top diode regions may be the same semiconductor crystalline material. The bottom region may be a different semiconductor crystalline material than at least the active region or the top diode region. The bottom and top diode regions may be doped with different doping concentrations. The top and active diode regions may be doped with different doping concentrations. The bottom and top diode regions may be doped with dopants of different types. Diode regions may be in situ doped or ion implanted.

At least one of the active and top diode regions may be formed by selective epitaxial growth including metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD).

The bottom, active and top regions may be repeated. At least a portion of the active region corresponding to a polar face may be removed. At least a portion of the bottom diode region or the top diode region corresponding to a polar face may be removed.

The method may comprise an intrinsic active region. The active region may comprise a depletion region.

The method may be a method of manufacturing an LED. The method may be a method of manufacturing a laser diode. The method may be a method of manufacturing a photovoltaic device.

Below lists further embodiments:

(1) A diode comprises one or more fins of polar crystalline material, wherein major faces of the one or more fins are non-polar, said one or more fins constituting a first cladding layer; an active region formed around said one or more fins; and a second cladding layer formed adjacent to said active region.

(2) A diode comprises a first cladding layer of a polar crystalline material including a first surface with one or more holes therein, sidewalls of the one or more holes being non-polar faces of the polar crystalline material; a second cladding layer opposite the first surface and extending at least partially into the one or more holes; and an active region interposed between the first and second cladding layers.

(3) A diode comprises a first diode region; an active region adjacent the first diode region; and a second diode region adjacent the active region, wherein an area of one or more surfaces of the first diode region adjacent the active region that are non-polar is greater than an area of one or more surfaces of the first diode region that are polar.

(4) A light emitting diode comprises a first diode region; an active diode region of a III-N semiconductor crystalline material adjacent the first diode region; and a second diode region adjacent the active diode region, wherein at least a portion of the active diode region corresponds to a non-polar plane of the first diode region.

(5) A light emitting diode comprises a bottom diode region from a III-N semiconductor material; an active diode region from a III-N semiconductor material adjacent the bottom diode region; and a top diode region from a III-N semiconductor material adjacent the active diode region, wherein the active and top diode regions have fewer defects per unit area than the bottom diode region.

(6) A light emitting diode comprises a bottom diode material having a cavity therein; an active diode region on a surface of the cavity; and depositing a top diode material in the cavity.

(7) A light emitting diode comprises bottom, active and top diode regions from III-N semiconductor material, wherein non-polar III-N semiconductor material in the LED is configured to increase an output efficiency.

(8) A light emitting diode comprises a bottom diode region of III-N semiconductor crystalline layer on a polar plane having at least one first surface aligned in a non-polar plane and at least one second surface aligned in a polar plane of the III-N semiconductor material layer; an active diode region adjacent the at least one first surface and the at least one second surface of the bottom diode region; and a top diode region adjacent the active diode region.

(9) A light emitting diode comprises a bottom diode region of III-N semiconductor material; an active diode region adjacent the bottom diode region on a non-polar surface of III-N semiconductor material; and a top diode region adjacent the active diode region.

(10) A light emitting diode comprises a first diode region; an active diode region adjacent the first diode region; and a second diode region adjacent the active diode region, wherein a first portion of the active diode region has a first output light efficiency and a second portion of the active diode region has a second lower output light efficiency.

The above-listed embodiments may each be further modified according to the features described below.

At least one of the active and top regions may have more total line defects than the bottom diode region.

A light output efficiency in a blue light LED may be more than 2 times greater, more than 5 times greater, more than 10 times greater or more than 25 times greater. A light output efficiency in a green light LED may be more than 2 times greater, more than 5 times greater, more than 10 times greater or more than 25 times greater. A light output efficiency in a white light LED may be more than 2 times greater, more than 5 times greater, more than 10 times greater or more than 25 times greater. A light output efficiency in a ultraviolet light LED may be more than 2 times greater, more than 10 times greater or more than 25 times greater. A light output efficiency in an infrared light LED may be more than 2 times greater, more than 5 times greater, more than 10 times greater or more than 25 times greater.

A ratio of non-polar surface area in the bottom diode region facing the active region to polar-plane surface area may be more than one. A ratio of non-polar surface area in the bottom diode region facing the active region to polar-plane surface area may be more than 2, more than 4, more than 10 or more than 50.

The active region may be III-N semiconductor material corresponding to a non-polar surface. A portion of the active diode region oriented to a polar surface of III-N semiconductor material may be less than 50%, less than 25%, less than 15%, less than 10% or less than 5%. A portion of the top diode region oriented to a polar surface of III-N semiconductor material may be less than 50%, less than 25%, less than 15%, less than 10% or less than 5%. A portion of the active region, the bottom diode region or the top diode region oriented to a polar surface of III-N semiconductor material may be less than 50%, less than 25%, less than 15%, less than 10% or less than 5%. A portion of the active region, the bottom diode region or the top diode region oriented to a non-polar surface of III-N semiconductor material may be greater than 50%, greater than 75%, greater than 85% or greater than 95%.

The diode regions may include one or more of the following: aluminum nitride (AlN), gallium nitride (GaN), indium nitride (InN), and their ternary and quaternary compounds. The diode regions may include GaN.

The bottom region may be configured with an opening, wherein the opening is a trench, recess or hole. The diode may comprise a semiconductor device configured over at least a part of the opening. The trench may be at least 2 times deeper than its width, at least 5 times deeper than its width, at least 10 times deeper than its width or the trench may be at least 100 times deeper than its width. The trench may be at least 10 times longer than its width or the trench may be at least 100 times longer than its width. The width of the openings may be one of 450 nm or less, 400 nm or less, 350 nm or less, 200 nm or less, 100 nm or less and 50 nm or less. The width of the openings may be one of 5 um or less, 2 um or less and 1 um or less.

The diode regions may be epitaxially grown. The diode may further comprise a CMOS device integrated with a substrate. A substrate may comprise silicon, germanium or sapphire. A surface of the substrate exposed in the insulator pattern opening may be a (100) surface of the silicon substrate, and the substrate may be a single crystal substrate or a polycrystalline substrate.

The bottom, active and top diode regions may be the same semiconductor crystalline material. The bottom region may be a different semiconductor crystalline material than at least the active region or the top diode region. The bottom and top diode regions may be doped with different doping concentrations. The top and active diode regions may be doped with different doping concentrations. The bottom and top diode regions may be doped with dopants of different types. Diode regions may be in situ doped or ion implanted.

At least one of the active region and top diode region may be formed by selective epitaxial growth including metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD).

The bottom, active and top regions may be repeated. At least a portion of the active region corresponding to a polar face may be removed. At least a portion of the bottom diode region or the top diode region corresponding to a polar face may be removed.

The diode may comprise an intrinsic active region. The active region may comprise a depletion region. The diode may be an LED, a laser diode, or a photovoltaic device.

What is claimed is:

1. A method comprising:
   providing a first layer of a first semiconductor crystalline material over a substrate, the first layer having a polar top surface;
   forming a recess in the first layer, the recess having a non-polar sidewall surface of the first semiconductor crystalline material; and
   forming a second layer of a second semiconductor crystalline material along the non-polar sidewall surface of the recess, the first layer forming a first diode region, the second layer forming a second diode region, an active region being interposed between the first diode region and the second diode region, the first diode region, the active region, and the second diode region forming a diode.

2. The method of claim 1, wherein a ratio of non-polar surface area of the first layer of the diode to polar surface area of the first layer of the diode is more than one.

3. The method of claim 1, wherein the first semiconductor crystalline material and the second semiconductor crystalline material are a same semiconductor crystalline material.

4. The method of claim 1, wherein the first semiconductor crystalline material and the second semiconductor crystalline material are different semiconductor crystalline materials.

5. The method of claim 1 further comprising removing at least a portion of the second layer along the polar top surface.

6. The method of claim 1 further comprising after forming the second layer, removing at least a portion of the first layer or the second layer corresponding to a bottom polar surface of the recess.

7. The method of claim 1 further comprising:
   forming a first contact adjacent the substrate; and
   forming a second contact adjacent the second layer.

8. A method comprising:
   forming a first diode region comprising a III-N semiconductor crystalline material having a polar plane and a non-polar plane; and
   forming a second diode region proximate the first diode region, an active diode region being disposed between the first diode region and the second diode region, at least a portion of the active diode region and the second diode region being along the polar plane and the non-polar plane of the III-N semiconductor crystalline material.

9. The method of claim 8, wherein a ratio of a non-polar surface area of the first diode region to a polar surface area of the first diode region is more than one.

10. The method of claim 8, wherein the first diode region has a recess, the non-polar plane being a sidewall of the recess.

11. The method of claim 8, wherein the first diode region and the second diode region are a same semiconductor crystalline material.

12. The method of claim 8, wherein the first diode region and the second diode region are a different semiconductor crystalline material.

13. The method of claim 8 further comprising removing at least a portion of the active diode region corresponding to a polar face.

14. The method of claim 8 further comprising removing at least a portion of the first diode region or the second diode region corresponding to a polar face.

15. A method comprising:
providing III-N semiconductor crystalline layer over a substrate, the III-N semiconductor crystalline layer having a polar plane top surface;
forming a bottom diode region having at least one first surface aligned in a non-polar plane of the III-N semiconductor crystalline layer and at least one second surface aligned in a polar plane of the III-N semiconductor crystalline layer;
forming an active diode region adjacent the at least one first surface and the at least one second surface of the bottom diode region; and
forming a top diode region adjacent the active diode region.

16. The method of claim 15, wherein a ratio of non-polar surface area in the bottom diode region to polar-plane surface area is more than one.

17. The method of claim 15, wherein the forming the bottom diode region comprises forming a recess in the III-N semiconductor crystalline layer, the at least one first surface aligned in a non-polar plane of the III-N semiconductor crystalline layer comprising a sidewall of the recess.

18. The method of claim 15, wherein the bottom diode region is a different semiconductor crystalline material than at least the active region or the top diode region.

19. The method of claim 15, wherein at least a portion of the active diode region corresponding to a polar face of the III-N semiconductor crystalline layer is removed.

20. The method of claim 15, wherein at least a portion of the bottom diode region or the top diode region corresponding to a polar face of the III-N semiconductor crystalline layer is removed.

* * * * *